(12) United States Patent
Bibl et al.

(10) Patent No.: US 8,928,021 B1
(45) Date of Patent: Jan. 6, 2015

(54) LED LIGHT PIPE

(71) Applicant: LuxVue Technology Corporation, Santa Clara, CA (US)

(72) Inventors: Andreas Bibl, Los Altos, CA (US); Kelly McGroddy, San Francisco, CA (US)

(73) Assignee: LuxVue Technology Corporation, Santa Clara, CA (US)

( * ) Notice: Subject to any disclaimer, the term of this patent is extended or adjusted under 35 U.S.C. 154(b) by 52 days.

(21) Appl. No.: 13/920,925

(22) Filed: Jun. 18, 2013

(51) Int. Cl.
*H01L 33/00* (2010.01)
*H01L 33/50* (2010.01)
*H01L 33/08* (2010.01)

(52) U.S. Cl.
CPC ............... *H01L 33/50* (2013.01); *H01L 33/08* (2013.01)
USPC ........ 257/98; 257/99; 257/100; 257/E33.072; 257/E33.073

(58) Field of Classification Search
USPC ............... 257/98, 99, 100, E33.072, E33.073
See application file for complete search history.

(56) References Cited

U.S. PATENT DOCUMENTS

| | | |
|---|---|---|
| 5,442,254 A | 8/1995 | Jaskie |
| 5,592,358 A | 1/1997 | Shamouilian et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,786,390 B2 | 9/2004 | Yang et al. |
| 6,878,607 B2 | 4/2005 | Inoue et al. |
| 7,033,842 B2 | 4/2006 | Haji et al. |

(Continued)

FOREIGN PATENT DOCUMENTS

| | | |
|---|---|---|
| EP | 1780798 A1 | 5/2007 |
| JP | 07-060675 A | 3/1995 |

(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

(Continued)

*Primary Examiner* — Minh-Loan Tran
(74) *Attorney, Agent, or Firm* — Blakely, Sokoloff, Taylor & Zafman LLP

(57) ABSTRACT

A light emitting device and method of manufacture are described. In an embodiment, the light emitting device includes a micro LED device, a light pipe around the micro LED device to cause internal reflection of incident light from the micro LED device within the light pipe, and a wavelength conversion layer comprising phosphor particles over the light pipe. Exemplary phosphor particles include quantum dots that exhibit luminescence due to their size, or particles that exhibit luminescence due to their composition.

24 Claims, 28 Drawing Sheets

(56) References Cited

U.S. PATENT DOCUMENTS

| | | | |
|---|---|---|---|
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,399,429 B2 | 7/2008 | Liu et al. |
| 7,482,059 B2 | 1/2009 | Peng et al. |
| 7,482,696 B2 | 1/2009 | Shei |
| 7,585,703 B2 | 9/2009 | Matsumura et al. |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,264,777 B2 | 9/2012 | Skipor et al. |
| 8,294,168 B2 | 10/2012 | Park et al. |
| 8,329,485 B2 | 12/2012 | McKean |
| 8,333,860 B1 | 12/2012 | Bibl et al. |
| 8,349,116 B1 | 1/2013 | Bibl et al. |
| 8,368,104 B2 * | 2/2013 | Hikosaka et al. ............ 257/98 |
| 8,415,767 B1 | 4/2013 | Golda et al. |
| 8,415,768 B1 | 4/2013 | Golda et al. |
| 8,415,771 B1 | 4/2013 | Golda et al. |
| 8,426,227 B1 | 4/2013 | Bibl et al. |
| 8,497,143 B2 | 7/2013 | Han |
| 8,497,512 B2 | 7/2013 | Nakamura et al. |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0177633 A1 | 9/2003 | Haji et al. |
| 2004/0232439 A1 | 11/2004 | Gibb et al. |
| 2005/0232728 A1 | 10/2005 | Rice et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0169993 A1 | 8/2006 | Fan et al. |
| 2006/0214299 A1 | 9/2006 | Fairchild et al. |
| 2007/0048902 A1 | 3/2007 | Hiatt et al. |
| 2007/0111324 A1 | 5/2007 | Nie et al. |
| 2007/0166851 A1 | 7/2007 | Tran et al. |
| 2007/0194330 A1 | 8/2007 | Ibbetson et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0283190 A1 | 11/2008 | Papworth et al. |
| 2008/0303038 A1 | 12/2008 | Grotsch et al. |
| 2009/0068774 A1 | 3/2009 | Slater et al. |
| 2009/0146303 A1 | 6/2009 | Kwon |
| 2009/0303713 A1 | 12/2009 | Chang et al. |
| 2009/0314991 A1 | 12/2009 | Cho et al. |
| 2010/0105172 A1 | 4/2010 | Li et al. |
| 2010/0188794 A1 | 7/2010 | Park et al. |
| 2010/0203659 A1 | 8/2010 | Akaike et al. |
| 2010/0203661 A1 | 8/2010 | Hodota |
| 2010/0248484 A1 | 9/2010 | Bower et al. |
| 2010/0276726 A1 | 11/2010 | Cho et al. |
| 2011/0003410 A1 | 1/2011 | Tsay et al. |
| 2011/0049540 A1 | 3/2011 | Wang et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0284867 A1 | 11/2011 | Tran et al. |
| 2012/0018746 A1 | 1/2012 | Hsieh |
| 2012/0032573 A1 | 2/2012 | Lai |
| 2012/0064642 A1 | 3/2012 | Huang et al. |
| 2012/0134065 A1 | 5/2012 | Furuya et al. |
| 2012/0168776 A1 | 7/2012 | Nakamura et al. |
| 2012/0250304 A1 | 10/2012 | Harbers et al. |
| 2012/0286208 A1 | 11/2012 | McKean et al. |
| 2012/0326188 A1 | 12/2012 | Han |
| 2013/0126081 A1 | 5/2013 | Hu et al. |
| 2013/0187179 A1 | 7/2013 | Tan et al. |
| 2014/0159064 A1 | 6/2014 | Sakariya et al. |

FOREIGN PATENT DOCUMENTS

| | | |
|---|---|---|
| JP | 3406207 | 5/1999 |
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2008-200821 A | 9/2008 |
| JP | 2010-056458 A | 3/2010 |
| JP | 2010-186829 A | 8/2010 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| WO | WO 2005-099310 A2 | 10/2005 |
| WO | WO 2011/123285 | 10/2011 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

(56) References Cited

OTHER PUBLICATIONS

Widas, Robert, "Electrostatic Substrate Clamping for Next Generation Semiconductor Devices" Apr. 21, 1999, 4 pgs.
Griffin, C., et al, "Micro-pixellated flip-chip InGaN and AlInGaN light-emitting diodes," Optical Society of America, 2007, 2 pgs.
Patel, Prachi, "Quantum Dots Are Behind New Displays," IEEE Spectrum, accessed at http://spectrum.ieee.org/consumer-electronics/audiovideo/quantum-dots-are-behind-new-displays, Jun. 13, 2012, updated Jul. 17, 2012, 3 pgs.

Pickett, et al., "Matters—Commercial volumes of quantum dots: controlled nanoscale synthesis and micron-scale applications," Nanoco Group PLC, accessed at http://www.nanocotechnologies.com/content/Library/NewsandEvents/articles/Material_Matters_Commerical_volumes_of_quantum_dots_controlled_nanoscale_synthesis_and_micronscale_applications/45.aspx, Dec. 13, 2007, 6 pgs.

* cited by examiner

LED LIGHT PIPE

BACKGROUND

1. Field

The present invention relates to micro LED devices. More particularly embodiments of the present invention relate to a method and structure for integrating micro LED devices on a substrate with increased fill factor and tunable color emission spectrum.

2. Background Information

Quantum dots are semiconductor nanocrystals that can be tuned to emit light throughout the visible and infrared spectrum. Due to the small size of 1 to 100 nm, more typically 1 to 20 nm, quantum dots display unique optical properties that are different from those of the corresponding bulk material. The wavelength, and hence color, of the photo emission is strongly dependent on the size of a quantum dot. For an exemplary cadmium selenide (CdSe) quantum dot, light emission can be gradually tuned from red for a 5 nm diameter quantum dot, to the violet region for a 1.5 nm quantum dot. There are generally two types of schemes for quantum dot (QD) excitation. One uses photo excitation, and the other uses direct electrical excitation.

One proposed implementation for quantum dots is integration into the backlighting of a liquid crystal display (LCD) panel. Current white light emitting diode (LED) backlight technology for LCD panels utilizes a cerium doped YAG:Ce (yttrium aluminum garnet) down-conversion phosphor layer over a plurality of blue emitting LED chips. The combination of blue light from the LED chips and a broad yellow emission from the YAG:Ce phosphor results in a near white light. It has been proposed to replace the YAG:Ce phosphor with a blend of quantum dots to achieve the white backlighting. U.S. Pat. No. 8,294,168 describes arranging a quantum dot sealing package over a package including a row of light emitting device chips in an edge-type backlight unit light source module. The light source module is positioned at an edge of the LED display panel so that it emits light through a side surface of a light guide plate behind the LED display panel, where the light is reflected toward the LCD display panel.

SUMMARY OF THE INVENTION

Light emitting devices for lighting or display applications are disclosed. In an embodiment a light emitting device includes a micro LED device mounted on a substrate. A light pipe is formed around the micro LED device, and a wavelength conversion layer comprising phosphor particles is formed over the light pipe. The light pipe in accordance with embodiments of the invention is designed to allow refraction of incident light form the micro LED device out of the light pipe toward the wavelength conversion layer, as well as to cause internal reflection and lateral spreading of incident light from the micro LED device within the light pipe. Exemplary micro LED devices may have a maximum width of 1 µm-100 µm. The light pipe may assume a variety of configurations. For example, the light pipe may have an elongated dome shape characterized by a lateral length that is greater than a thickness. The light pipe may also be thicker than the micro LED device around which it is formed. In some embodiments the light pipe may be formed around a plurality of micro LED devices.

Exemplary phosphor particles may include quantum dots, as well as phosphor particles that exhibit luminescence due to their composition and do not qualify as quantum dots. In some embodiments the phosphor particles are dispersed in a polymer or glass matrix. The light pipe likewise may be formed of a polymer or glass material, which may be the same or different than the wavelength conversion layer matrix material. In some embodiments the refractive indices of the light pipe and wavelength conversion layer may be closely matched, such as within 0.1.

Reflective layers may additionally be formed over the micro LED devices. For example, a reflective layer can be formed over the wavelength conversion layer. Alternatively, a reflective layer is formed between the light pipe and wavelength conversion layer. A separate reflective layer can be formed beneath the micro LED device and the light pipe. For example, the micro LED device can be mounted within a reflective bank structure.

A variety of combinations of light emission spectra for the micro LED devices and wavelength conversion layers are possible to achieve a specific color emission spectrum for a light emitting device including an array of micro LED devices, a corresponding array of light pipes around the array of micro LED devices, and an array of wavelength conversions layers over the array of light pipes. For example, a light emitting device may have a plurality of pixels, with each including subpixels that have different color emission spectra. Color emission spectra of a subpixel can be determined by the emission spectrum of a micro LED device, a wavelength conversion layer, or both. Accordingly, a pixel may include different groups of micro LED devices designed for different color emission spectra, different wavelength conversion layers designed for different color emission spectra, or both, separated into the different subpixels. For example, a light emitting device can include a first subpixel including a first micro LED device and a first light pipe, and a second subpixel including a second micro LED device and a second light pipe. In one embodiment, a first wavelength conversion layer (including first phosphor particles) is formed over the first light pipe and a second wavelength conversion layer (including second phosphor particles) is formed over the second light pipe, where the first and second micro LED devices have the same composition for the same emission spectrum, and the first and second wavelength conversion layers (first and second phosphor particles) are designed for different color emission spectra. In another embodiment, a first wavelength conversion layer is formed over the first light pipe, and a wavelength conversion layer is not formed over the second light pipe.

In an embodiment the light emitting device includes an array of pixels, with each pixel including a plurality of subpixels designed for different color emission spectra. An array of light pipes are formed corresponding to the array of pixels such that each light pipe spans the plurality of subpixels for a corresponding pixel. For example, in an RGB pixel arrangement, the light pipe could span the R, G, and B subpixels. A micro LED device may or may not be mounted within each subpixel over which a light pipe is formed. In one application, a micro LED device is mounted within each subpixel and within the light pipe. In another application, one or more of the subpixels may not include a micro LED device. Likewise, a wavelength conversion layer may or may not be formed over light pipe where it spans over the multiple subpixels. In these manners, light from a micro LED device in an adjacent subpixel can pass through the light pipe where it is refracted out and through the wavelength conversion layer in an adjacent subpixel. Different wavelength conversion layers of designed for different color emission spectra can be formed over each light pipe where it spans over the plurality of subpixels of a corresponding pixel.

DETAILED DESCRIPTION OF THE INVENTION

Figure 1A:
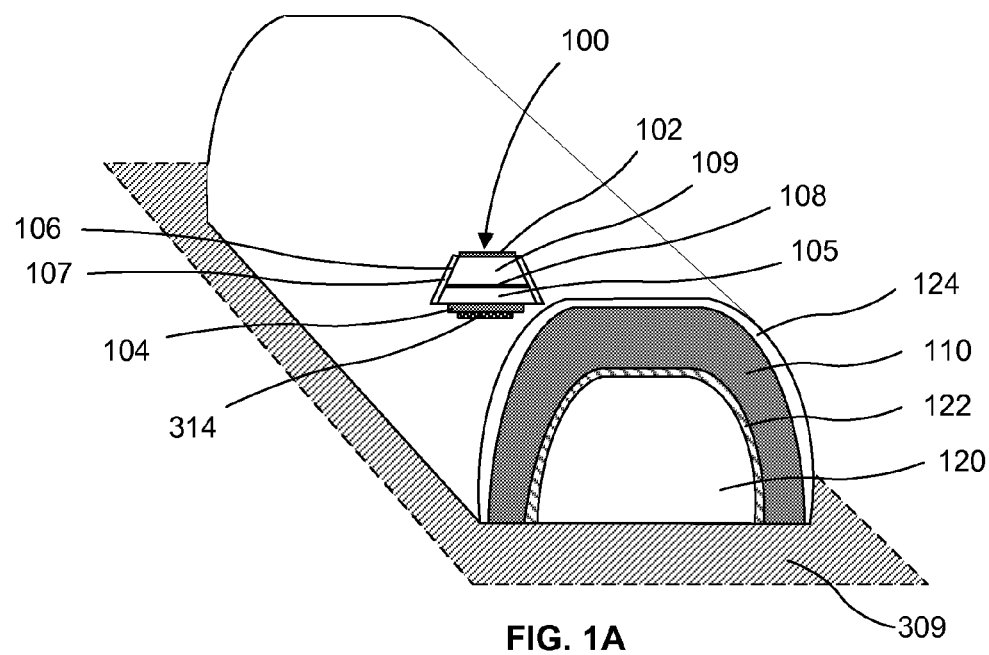
FIG. 1A is combination view illustration of a light pipe around a micro LED device and a wavelength conversion layer over the light pipe in accordance with an embodiment of the invention.

Embodiments of the present invention describe light emitting devices which incorporate a light pipe around a micro LED device and a wavelength conversion layer over the light pipe. The light emitting devices in accordance with embodiments of the invention may include a plurality of micro LED devices, a plurality of light pipes, and a plurality of wavelength conversion layers. The light emitted from the configuration of micro LED devices, light pipes, and wavelength conversion layers may be the observable light emitted from the light emitting devices, such as a display or light source. In accordance with embodiments of the invention, the light pipes may increase the fill factor for the micro LED devices, pixels, or subpixels including the micro LED devices, by both allowing refraction of incident light from the micro LED devices out of the light pipes toward the wavelength conversion layers, and causing internal reflection and lateral spreading of the incident light from the micro LED devices within the light pipes. Furthermore, a variety of color emission spectra and patterns can be accomplished by selection of emission spectrum combinations for the micro LED devices and the wavelength conversion layers, where present, in the light emitting devices. In an embodiment, the wavelength conversion layer includes phosphor particles (e.g. quantum dots that exhibit luminescence due to their size and shape in addition to their composition, or particles that exhibit luminescence due to their composition). In this manner, the light emission can be accurately tuned to specific colors in the color spectrum, with improved color gamut.

In some embodiments, a light pipe also functions as a portion of a micro lens formed around one or more micro LED devices where incident light from the micro LED devices is refracted out of the light pipe. Each micro lens structure may include a variety of configurations and optionally include a number of different layers in addition to the light pipe including a matching layer, the wavelength conversion layer, oxygen barrier, and color filter. In some embodiments, a lateral length of the light pipe is greater than a thickness of the light pipe. In some embodiments, the light pipe can be dome shaped. In an embodiment, the light pipe is elongated dome shaped. The dome shape profile may be hemispherical, flattened, or narrowed. Flattening or narrowing of the dome profile can be used to adjust viewing angle for the light emitting device. In accordance with embodiments of the invention, the thickness and profile the layers forming the micro lens structure can be adjusted in order to change the light emission beam profile from the micro LED device, as well as color over angle characteristics of the light emitting device which can be related to edge effects.

In one aspect, the incorporation of micro LED devices in accordance with embodiments of the invention can be used to combine the performance, efficiency, and reliability of wafer-based LED devices with the high yield, low cost, mixed materials of thin film electronics, for both lighting and display applications. The term "micro" LED device as used herein may refer to the descriptive size scale of 1 to 100 µm. For example, each micro LED device may have a maximum width of 1 to 100 µm, with smaller micro LED devices consuming less power. In some embodiments, the micro LED devices may have a maximum width of 20 µm, 10 µm, or 5 µm. In some embodiments, the micro LED devices have a maximum height of less than 20 µm, 10 µm, or 5 µm. Exemplary micro LED devices which may be utilized with some embodiments of the invention are described in U.S. Pat. No. 8,426,227, U.S. Publication No. 2013/0126081, U.S. patent application Ser. No. 13/458,932, U.S. patent application Ser. No. 13/711,554, and U.S. patent application Ser. No. 13/749,647. The light emitting devices in accordance with embodiments of the invention may be highly efficient at light emission and consume very little power (e.g., 250 mW for a 10 inch diagonal display compared to 5-10 watts for a 10 inch diagonal LCD or OLED display), enabling reduction of power consumption of an exemplary display or lighting application incorporating the micro LED devices.

In another aspect, embodiments of the invention describe light pipe configurations that can increase the fill factor for micro LED devices, or pixels including micro LED devices. Wafer-based LED devices can be characterized as point sources, where light emission occupies a small area and has a concentrated output. If wafer-based LED devices are secured far enough apart that they can be perceived by the human eye (e.g. approximately 100 µm or more) it may be possible that the light emitted from the individual LED devices is perceived as small dots. The light pipe configurations described in accordance with embodiments of the invention can be used to increase the fill factor for micro LED devices, pixels, or sub-pixels including micro LED devices, so that the individual micro LED devices are not distinguishable by the human eye, and small dots are not perceived.

In another aspect, embodiments of the invention provide for configurations that allow phosphor particles of different emission spectra to be separated from one another while still providing good color mixing of the light as perceived by the viewer. Separating the phosphor particles from each other in each subpixel can prevent secondary absorption of light emitted from a phosphor particle emitting a different spectrum (e.g. absorption of green light emitted from a green emitting phosphor particle by a red emitting phosphor particle). This may increase efficiency and reduce unintended color shift. In the micro LED device systems in accordance with embodiments of the invention the spatial color separation between different color emitting areas (e.g. subpixels) can be small enough (e.g. approximately 100 µm or less) that it will not be perceived by the human eye. In this manner, the "micro" LED device scale enables the arrangement of micro LED devices, light pipes, and wavelength conversion layers including phosphor particles with small enough pitch (e.g. approximately 100 µm or less) between adjacent micro LED devices or subpixels that the spatial color separation is not perceived by the human eye. In such a configuration, spatially non-uniform color of the light source often associated with non-micro LED device systems can be avoided.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the particular features, structures, configurations, or characteristics may be combined in any suitable manner in one or more embodiments.

The terms "spanning", "over", "to", "between" and "on" as used herein may refer to a relative position of one layer with respect to other layers. One layer "spanning", "over" or "on" another layer or bonded "to" another layer may be directly in contact with the other layer or may have one or more intervening layers. One layer "between" layers may be directly in contact with the layers or may have one or more intervening layers.

Referring now to FIG. 1A a combination view is provided of a light pipe around a micro LED device and wavelength conversion layer over the light pipe in accordance with an embodiment of the invention. FIG. 1A is referred to as a combination view because it includes characteristics of an isometric view, plan view for location of the micro LED device, and cross-sectional view of the layers. In the particular embodiment illustrated, the micro LED devices 100 include a vertical micro p-n diode between a bottom contact 104 and top contact 102. In an embodiment, the micro p-n diode is several microns thick, such as 30 µm or less, or even 5 µm or less, with the top and bottom contacts 104, 102 being 0.1 µm-2 µm thick. The micro p-n diode may include a n-doped layer 109, a p-doped layer 105, and one or more quantum well layers 108 between the n-doped layer and p-doped layer. In the particular embodiment illustrated in FIG. 1A the n-doped layer 109 is illustrated as being above the p-doped layer 105. Alternatively, the p-doped layer 105 may be above the n-doped layer 109. The micro LED devices 100 may have straight or tapered sidewalls 106 (from top to bottom). The top and bottom contacts 102, 104 may include one or more layers and can be formed of a variety of electrically conducting materials including metals, conductive oxides, and conductive polymers. The top and bottom contacts 102, 104 may be transparent or semi-transparent to the visible wavelength spectrum (e.g. 380 nm-750 nm) or opaque. The top and bottom contacts 102, 104 may optionally include a reflective layer, such as a silver layer. In an embodiment, a conformal dielectric barrier layer 107 may optionally be formed along the sidewalls 106 of the p-n diode to electrically passivate the quantum well 108, and optionally along the top or bottom surface of the micro p-n diode. The conformal dielectric barrier layer 107 may be thinner than the p-n diode so that it forms an outline of the topography of the p-n diode it is formed on. For example, the conformal dielectric barrier layer 107 may be approximately 50-600 angstroms thick aluminum oxide.

In an embodiment, the micro LED device 100 is secured over a reflective layer 309. The reflective layer 309 may assume a number of different configurations. As described in further detail below, the reflective layer can be a stand-alone layer, an electrode, an electrode line, or a reflective bank layer. Reflective layer 309 may also function as an anode, cathode, or ground, or an electrical line to anode, cathode, or ground. In an embodiment, the reflective layer is a bottom electrode. In an embodiment, reflective layer 309 comprises a reflective metallic film such as aluminum, molybdenum, titanium, titanium-tungsten, silver, or gold, or alloys thereof. In application, the reflective layer may include a stack of layers or metallic films.

A bonding layer 314 may optionally be formed between the micro LED device 100 and the bottom electrode or reflective layer 309 to facilitate bonding of the bottom contact 104 of micro LED device 100 to the reflective layer 309, or other intervening layer. In an embodiment, bonding layer 314 includes a material such as indium, gold, silver, molybdenum, tin, aluminum, silicon, or an alloy or alloys thereof.

Figure 1B:
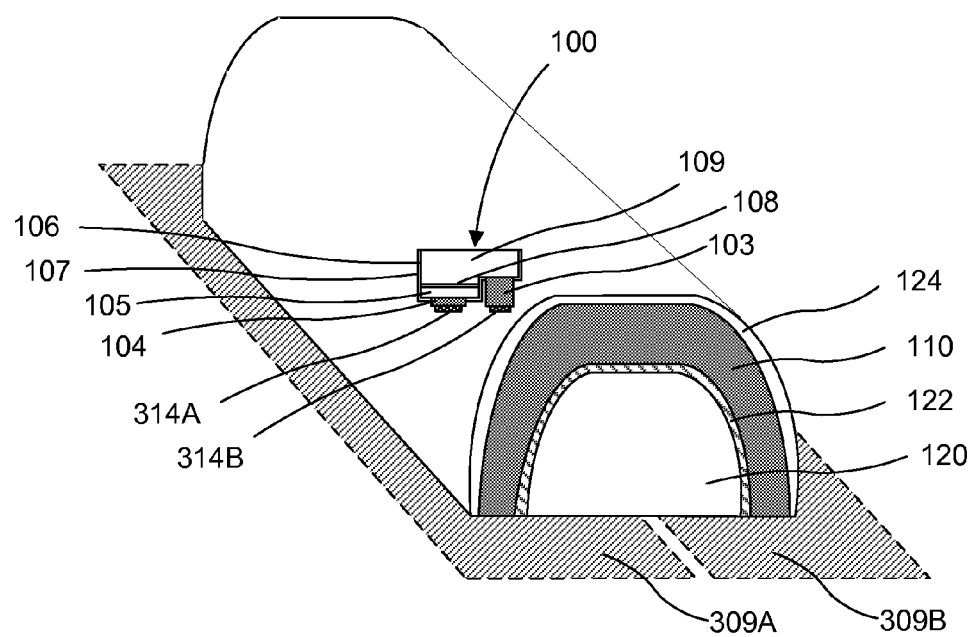
FIG. 1B is combination view illustration of a light pipe around a micro LED device and a wavelength conversion layer over the light pipe in accordance with an embodiment of the invention.

It is to be appreciated, that the specific vertical micro LED device 100 illustrated in FIG. 1A is exemplary and that embodiments of the invention may also be practiced with other micro LED devices. For example, FIG. 1B illustrates an alternative micro LED device 100 in a light pipe configuration similar to that in FIG. 1A. Similar to the micro LED device of FIG. 1A, the micro LED device in FIG. 1B includes a micro p-n diode including doped layers 105, 109 opposite one or more quantum well layers 108. Unlike the micro LED device of FIG. 1B, the micro LED device in FIG. 1B includes bottom contacts to both the doped layers 105, 109. For example, bottom contact 104 and bottom bonding layer 314A are formed on doped layer 105, and bottom contact 103 and bottom bonding layer 314B are formed on doped layer 109. A conformal dielectric barrier layer 107 may also be optionally formed on the micro LED device of FIG. 1B, particularly to protect sidewalls 106 including the quantum well layer(s) 108. Since the micro LED device 100 of FIG. 1B includes bottom contacts for both the n-doped and p-doped layers, the bottom electrode or reflective layer 309 may also be separated into two electrically separate layers 309A, 309B to make electrical contact with bottom contacts 104, 103, respectively. Accordingly, the micro LED device of FIG. 1B may be implemented within embodiments of the invention where it is not required to have top and bottom contacts, and the micro LED devices can be operably connected with bottom contacts.

Figure 1C:
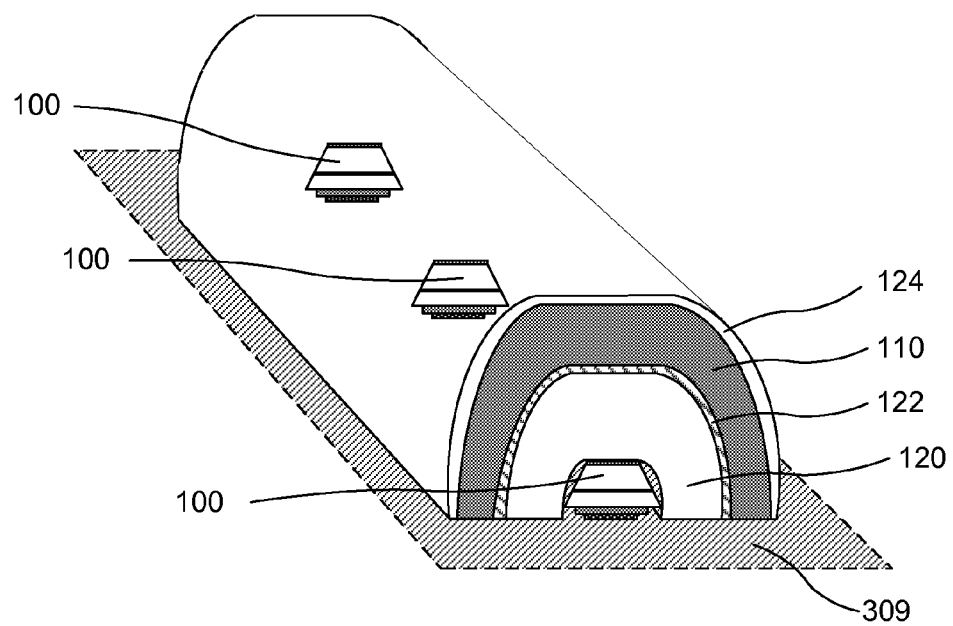
FIG. 1C is combination view illustration of a light pipe around a plurality of micro LED devices and a wavelength conversion layer over the light pipe in accordance with an embodiment of the invention.

As shown in FIGS. 1A-1B a light pipe 120 is formed around the micro LED device 100. Referring now to FIG. 1C combination view illustration is shown of a light pipe around a plurality of micro LED devices and a wavelength conversion layer over the light pipe in accordance with an embodiment of the invention. As described herein a layer "around" a micro LED device may be formed laterally to, over, or below the micro LED device. Thus, the term "around" a micro LED device does not require the layer to be located at all directions from the micro LED device. Rather, the term "around" is intended to refer to a neighboring area through which the light emission beam path from the micro LED device is designed to pass through. In the particular embodiments illustrated in FIGS. 1A-1C, the light pipe around the micro LED devices 100 is both lateral to and over the micro LED devices.

The light pipe 120 may be shaped to both allow refraction of incident light from the micro LED device 100 out of the light pipe and toward a wavelength conversion layer 110, and to cause internal reflection and lateral spreading of incident light form the micro LED device 100 within the light pipe 120. The light pipe 120 may be thicker than the micro LED device 100. In an embodiment, the light pipe 120 is 1 µm-100 µm thick. The lateral length/width of the light pipe may be greater than the thickness of the light pipe in order to support lateral spreading of the incident light. In an exemplary embodiment, considering a 100 µm×100 µm wide subpixel, a light pipe 120 may have a lateral length of 100 µm, a lateral width of 100 µm and a height that is equal to or less than the maximum lateral length or width.

The light pipe 120 may also be dome shaped to create radial spreading of the light refracted out of the light pipe. In some embodiments, the light pipe 120 is elongated dome shaped. The dome shape profile may be hemispherical. The dome shape may also be flattened to create a wider emission profile, or narrowed to create a narrower emission profile. In an embodiment, the thickness and profile of the light pipe 120 provides a base structure upon which a micro lens structure is formed in order to change the light emission beam profile from the micro LED device 100, as well as color over angle characteristics of the light emitting device which can be related to edge effects. Light pipe 120 may be formed of a variety of transparent materials such as epoxy, silicone, and acrylic, which have the following reported refractive indices (n) at nominal 590 nm wavelength: n=1.51-1.57 (epoxy), n=1.38-1.58 (silicone), n=1.49 (acrylic).

In an embodiment, light pipe 120 is formed by ink jet printing. In an embodiment, the light pipe 120 is formed by application of a molten glass. Glass compositions can range from a variety of compositions ranging from acrylic grass, crown glass, flint glass, and borosilicate glasses that possess indices of refraction that can be matched to those of epoxy, silicone, or acrylic above. The particular profile of the light pipe can be created through several processing techniques. One way is by tailoring surface tension on in ink printed materials. Lithography or other wafer-level optics techniques such as those used to form micro lenses may also be used. Physical techniques such as moulding or imprint lithography may also be used.

Figure 1D:
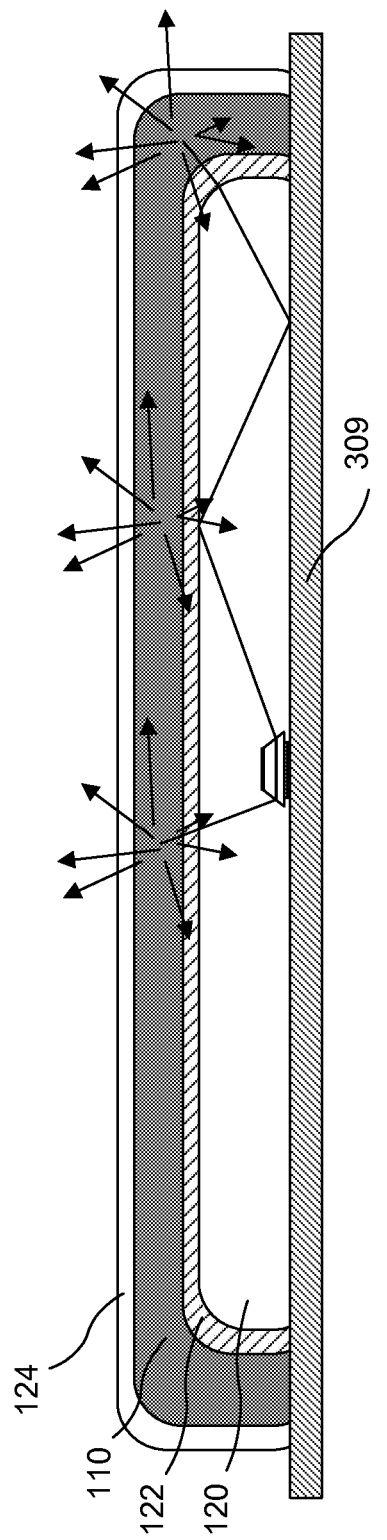
FIG. 1D is a cross-sectional side view illustration of a light pipe around a micro LED device and a wavelength conversion layer over the light pipe in accordance with an embodiment of the invention.
Figure 1E:
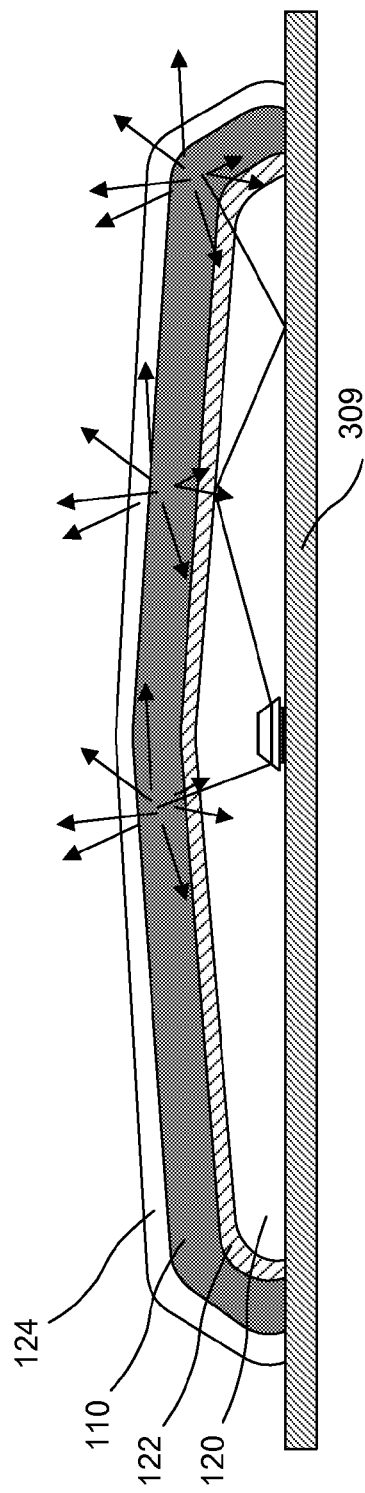
FIGS. 1E-1F are cross-sectional side view illustrations of a light pipe having a tapered profile in accordance with an embodiment of the invention.
Figure 1F:
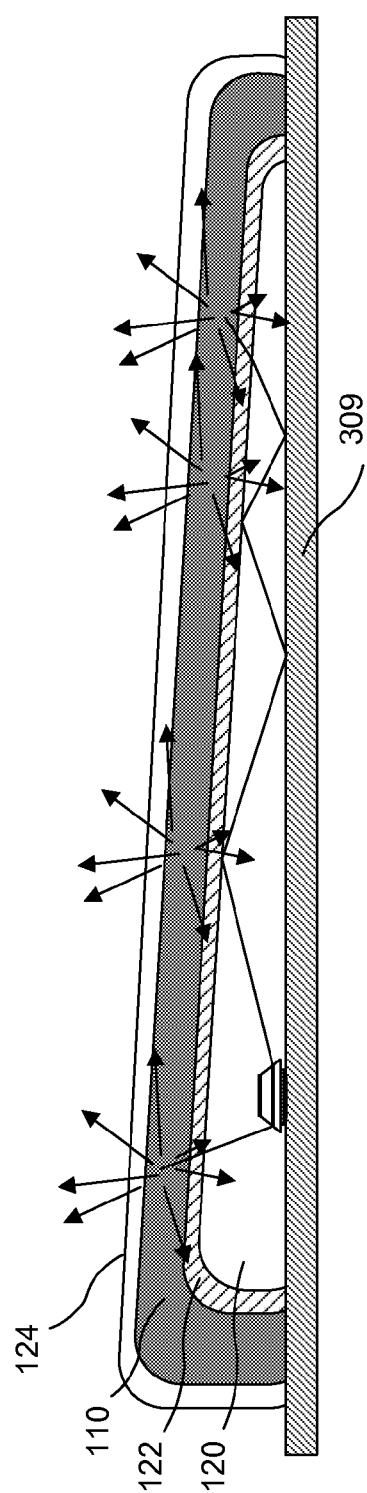

FIG. 1D is a cross-sectional side view illustration of a light pipe around a micro LED device and a wavelength conversion layer over the light pipe in accordance with an embodiment of the invention. As shown in FIG. 1D, incident light emitting from the micro LED device 100 can both be refracted out of the light pipe 120 and into the wavelength conversion layer 110, and also reflected internally within the light pipe to cause lateral spreading of the incident light from the micro LED device where the reflected light is eventually refracted out of the light pipe 120 and into the wavelength conversion layer 110. FIGS. 1E-1F are cross-sectional side view illustrations of a light pipe having a tapered profile in accordance with embodiments of the invention. In the particular embodiment illustrated in FIG. 1E, a micro LED device is placed in the middle of the light pipe 120, and the light pipe is tapered toward the lateral edges so that the light pipe is thinner at the edges than the middle. Tapering the thickness of the light pipe can result in increase reflection, causing the light to eventually refract through the top surface of the light pipe rather than through the edges. In the embodiment illustrated in FIG. 1F, a micro LED device is placed nearer an edge of the light pipe, which is tapered from one side to the other. In this manner, the light pipe 120 can guide the light from one side of the light pipe to the other where the light is refracted through the top surface rather than through a side of the light pipe.

In addition to allowing refraction and reflection of incident light from the micro LED device 100, light pipe 120 may also allow the light emitting from the micro LED device 100 to spread out prior to entering the wavelength conversion layer 110, which decreases the optical intensity of light entering the wavelength conversion layer. In one aspect, the internally reflected light allows for an improved fill factor of the micro LED device 100, or pixel including the micro LED device. In another aspect, the spread out light (including incident light not reflected, as well as reflected light) may result in more even emission from the wavelength conversion layer 110 to be formed over the light pipe. In another aspect, the light pipe may function to increase the length that light travels in the device before being emitted. This can result in a reduction of the optical density and reduce thermal degradation of the phosphor particles in wavelength conversion layer, prolonging lifetime of the light emitting device. This may also increase the chances of color conversion by the phosphor particles in the wavelength conversion layer without having to increase the volume loading of the phosphor particles in the wavelength conversion layer. In yet another aspect, spreading out of the light and reduction of the optical intensity may reduce the amount of back reflection from the wavelength conversion layer that is reabsorbed by the micro LED device 100. In accordance with embodiments of the invention, light pipe 120 may increase the fill factor, increase total light emission, increase emission uniformity, and increase sharpness of the color spectrum for the light emitting device. The thickness and profile of the light pipe may also provide a base structure from which a micro lens structure is formed in order to change the light emission beam profile from the micro LED device 100, as well as color over angle characteristics of the light emitting device which can be related to edge effects.

Following the formation of the light pipe 120, a matching layer 122 may optionally be formed over the light pipe 120 prior to forming the wavelength conversion layer 110. The matching layer 122 may function to match the indices of refraction for the light pipe 120 and wavelength conversion layer 110 to reduce back reflection of light. For example, where layers 120, 110 are formed of, for example, an epoxy, silicone, acrylic, or glass having different indices of refraction, the matching layer 122 is formed of an epoxy, silicone, acrylic, or glass having an index of refraction between that of layers 120, 110. In accordance with embodiments of the invention, the polymer matrix forming layers 120, 110 is the same, and layers 120, 110 have an identical index of refraction. In another embodiment, the index of refraction for layers 120, 110 is within 0.3, or more particularly within 0.1. In an embodiment, matching layer is 2 μm or less in thickness. In an embodiment, curing of the matching layer 122 may be thermal or UV.

In accordance with embodiments of the invention, a wavelength conversion layer 110 is formed over the micro LED device 100 and light pipe 120, and around the optional matching layer, if present. In an embodiment, the wavelength conversion layer includes phosphor particles to control the light emission spectrum. In one embodiment, the wavelength conversion layer includes different phosphor particles (different in designed size or shape, or composition) for a blended color emission spectrum (e.g. a combination of any of red, blue, green, yellow, etc). In another embodiment, the wavelength conversion layer includes phosphor particles designed for a single color emission spectrum (e.g. red, blue, green, yellow, etc).

In an embodiment, the wavelength conversion layer 110 is formed of phosphor particles. For example, the wavelength conversion layer is formed of a spray deposition method followed by removal of solvents. In an embodiment, the wavelength conversion layer includes a dispersion of phosphor particles in a matrix material such as a polymer or glass matrix material. Other filler materials such as pigment, dye, or scattering particles may also be dispersed within the matrix or among the phosphor particles themselves if no matrix material is present. In an embodiment, wavelength conversion layer 110 is formed by ink jet printing, and UV cured. In an embodiment, the wavelength conversion layer 110 is formed by application of a molten glass, where the fillers are thermally and chemically stable within the molten glass. The thickness of the wavelength conversion layer 110, as well a concentration of fillers, e.g. phosphor particles, pigment, dye, or light scattering particles are tuned to achieve the requisite color spectrum. For example, in an embodiment the thickness and concentration is tuned to minimize color bleeding from the micro LED device through the wavelength conversion layer, and maximize emission from the phosphor particles. Thickness of the wavelength conversion layer 110 (as well as light pipe 120) may also be partly determined by the spacing between micro LED devices. For example, micro LED devices may be spaced more closely together in high resolution display applications compared to lighting applications. In an embodiment, the wavelength conversion layer 110 is 5 μm-100 μm thick, or more specifically 30 μm-50 μm thick for an exemplary 5 μm wide and 3.5 μm tall micro LED device 100. In some embodiments, the thickness of the wavelength conversion layer and concentration of fillers may be designed to allow some light from the micro LED device 100 to pass through resulting a mix of the micro LED device light spectrum and the converted light spectrum to achieve a blended emission spectrum, for example, white light. Concentration of the color converting materials (e.g. phosphor particles, pigment, dye) as well as thickness of the layers can depend upon the particular application of the light emitting device, for example, if full color conversion (e.g. from blue to red, or blue to green, etc.) is to occur, if leakage or bleeding of light from the underlying micro LED device is to occur, or if a mixture of converting materials is employed. In an embodiment where full color conversion (e.g. from blue to red, or blue to green, etc.) occurs a volume loading percent of greater than 50% color converting materials may be included in the wavelength conversion layer. In an embodiment, the wavelength conversion layer includes greater than 50% volume loading of phosphor particles. The light pipe can function to increase the length that light travels in the device before being emitted in order to increase the chances of color conversion by the phosphor particles in the wavelength conversion layer without having to increase the volume loading of the phosphor particles in the wavelength conversion layer.

In accordance with embodiments of the invention, the term "phosphor" may refer to any type of wavelength converting material that will absorb light at one wavelength and emit light at another wavelength. One type of phosphor particle is a quantum dot. Quantum dots are semiconductor materials where the size of the structure is small enough (less than tens of nanometers) that the electrical and optical characteristics differ from the bulk properties due to quantum confinement effects. For example, the emission properties of quantum dots are related to their size and shape in addition to their composition. Fluorescence of quantum dots is a result of exciting a valence electron by absorbing a certain wavelength, followed by the emission of lower energy in the form of photons as the excited electrons return to the ground state. Quantum confinement causes the energy difference between the valence and conduction bands to change based on size and shape of the quantum dot meaning that the energy and wavelength of the emitted photons is determined by the size and shape of the quantum dot. The larger the quantum dot, the lower the energy of its fluorescence spectrum. Accordingly, smaller quantum dots emit bluer light (higher energy) and larger quantum dots emit redder light (lower energy). This allows size-dependent tuning of the semiconductor photoluminescence emission wavelength throughout the visible spectrum, with a sharp emission spectrum and high quantum efficiency.

Examples of quantum dot materials include, but are not limited to, groups II-VI, III-V, IV-VI semiconductor materials. Some exemplary compound semiconductors include CdS, CdSe, CdTe, ZnS, ZnSe, ZnTe, GaAs, GaP, GaAs, GaSb, HgS, HgSe, HgTe, InAs, InP, InSb, AlAs, AlP, AlSb. Some exemplary alloyed semiconductors include InGaP, ZnSeTe, ZnCdS, ZnCdSe, and CdSeS. Multi-core structures are also possible. Exemplary multi core configurations may include a semiconductor core material, a thin metal layer to protect the core from oxidation and to aid lattice matching, and a shell to enhance the luminescence properties. The shell may function to absorb light at a specific spectrum that is different from the emission spectrum from the quantum dot. The core and shell layers may be formed of the same material, and may be formed of any of the exemplary compound semiconductors or alloyed semiconductors listed above. The metal layer often comprises Zn or Cd.

In accordance with embodiments of the invention, one type of phosphor particle is a particle that exhibits luminescence due to its composition. Some exemplary phosphor particles that exhibit luminescence due to their composition include sulfides, aluminates, oxides, silicates, nitrides, YAG (optionally doped with cerium), and terbium aluminum garnet (TAG) based materials. Other exemplary materials include yellow-green emitting phosphors: $(Ca,Sr,Ba)Al_2O_4$:Eu (green), $(Lu,Y)_3Al_5O_{12}$:Ce$^{3+}$ (LuAG, YAG) (yellow-green), $Tb_3Al_5O_{12}$:Ce$^{3+}$ (TAG) (yellow-green); orange-red emitting phosphors: $BaMgAl_{10}O_{17}$:Eu$^{2+}$ (Mn$^{2+}$), $Ca_2Si_5N_8$:Eu$^{2+}$ (orange-red), (Zn,Mg)S:Mn (green, red), (Ca,Sr,Ba)S:Eu$^{2+}$ (red); uv-deep blue absorbing phosphors for blue and yellow-green emission: $(Mg,Ca,Sr,Ba)_2SiO_4$:Eu$^{2+}$ (uv-blue excitation, yellow emission), $(Mg,Ca,Sr,Ba)_3Si_2O_7$:Eu$^{2+}$ (uv-deep blue excitation, blue-green emission), $Ca_8Mg(SiO_4)_4Cl_2$:Eu$^{2+}$ (uv-deep blue excitation, blue emission); and phosphors that can emit over the full visible spectrum depending on composition and processing $(Sr,Ca,Ba)Si_xO_yN_z$:Eu$^{2+}$ (y>0 green, y=0 red), $Y_2O_2S$:Eu$^{3+}$ (blue-green), $(Ca,Mg,Y)_vSi_wAl_xO_yN_z$:Eu$^2$ (yellow-green-red). In some embodiments the particle size for such phosphor particles may be from 1 μm to 20 μm. In other embodiments, the particles size for such phosphor particles can be nanoparticles from 100 nm to 1 μm. The phosphor particles can also include a blend of the 1 μm to 20 μm particles and 100 nm to 1 μm nanoparticles. Nanoparticles may be useful, for example, to reduce the amount of settling when dispersed within a matrix material of a wavelength conversion layer prior to curing or solvent removal, which may result in more even distribution of the nanoparticles and light emission of the light emitting device.

Other materials may also be dispersed within the wavelength conversion layer. For example, the other materials may be dispersed within the matrix material, such as glass or polymer matrix of the wavelength conversion layer. In an embodiment, a light scattering agent such as a $TiO_2$ or $Al_2O_3$ particles are dispersed within the wavelength conversion layer. Such light scattering agents may have the effect of increasing the phosphor particle efficiency by increasing scattered light within the wavelength conversion layer. Such light scattering agents may additionally have the effect of reduced bleeding of the micro LED device emitted light through the wavelength conversion layer. Light scattering particles can also be used to control when and where light is emitted from the micro lens structure. For example, a higher concentration of light scattering particles can be placed at the ends of the micro lens structure, e.g. at lateral edges of the wavelength conversion layer, to direct the light out. In an embodiment, a pigment or dye may be dispersed within the wavelength conversion layer 110. This may have the effect of incorporating a color filter into the wavelength conversion layer. In an embodiment, the pigment or dye may have a color similar to the emission wavelength of the phosphor particle. In this manner, the pigment or die can absorb wavelengths other than those being emitted from the phosphor particle, further sharpening the emission spectrum of the assembly. For example, in a particular embodiment, the micro LED device 100 is a gallium nitride (GaN) based material, and emits a blue (e.g. 450 nm-495 nm) or deep blue (e.g. 420 nm-450 nm) light. Quantum dots designed for red emission may be dispersed in the wavelength conversion layer 110 in order to absorb the blue or deep blue emission from the micro LED device 100 and convert the emission wavelength to red. In such an embodiment, a red pigment or dye may also be dispersed within the wavelength conversion layer 110 to also absorb colors other than red. In this manner, the red pigment or dye may absorb additional blue or deep blue light, thereby reducing bleeding of the unconverted blue or deep blue light. Exemplary pigments include lithol rubine (Red), B-copper thalocyanine (Blue), and diarylide yellow (Yellow). It is to be appreciated that a blue micro LED device and red phosphor particles with red pigment or dye is exemplary and a variety of emission spectrum configurations for the micro LED devices and wavelength conversion layers, where present, are possible.

In accordance with some embodiments of the invention, the polymer matrix forming the wavelength conversion layer 110 may be permeable to oxygen or moisture. In an embodiment, following the formation of the wavelength conversion layer 110, an oxygen barrier film 124 may optionally be formed in order to protect the wavelength conversion layer 110 from oxygen or moisture absorption. For example, where wavelength conversion layer 110 includes quantum dots, the oxygen barrier film 124 can act as a barrier to oxygen or moisture absorption by the quantum dots, thereby prolonging the lifetime of the quantum dots in the lighting or display device. Suitable materials for the oxygen barrier film 124 include, but are not limited to, $Al_2O_3$, $SiO_2$, $SiN_x$, and glass. The deposition method for oxygen barrier film 124 may be a low temperature method in order to not thermally degrade the quantum dots or other fillers. Exemplary conformal deposition methods include atomic layer deposition (ALD), sputtering, spin on, and lamination. The oxygen barrier film may also be blanket deposited over the entire substrate, or over all of the micro LED devices. In an embodiment, an $Al_2O_3$ oxygen barrier film is deposited by atomic layer deposition (ALD).

In accordance with embodiments of the invention, the light emitting device configurations including the micro LED devices, light pipes, and wavelength conversion layers can be incorporated into a variety of lighting or display devices. The wavelength conversion layers that are formed over the light pipes can be designed to all emit the same color emission spectrum, or the wavelength conversion layers can be divided into multiple groups of wavelength conversion layers, with each group designed to emit a different color emission spectrum. In this manner, the light emitting devices can emit any color or patterns of colors depending upon the arrangement and content of the micro LED devices, light pipes, and wavelength conversion layers. In one embodiment, white light can be generated by incorporating red (e.g. 620 nm-750 nm) and green (e.g. 495 nm-570 nm) emitting phosphor particles in a wavelength conversion layer positioned over a light pipe formed around a blue emitting (e.g. 450 nm-495 nm) micro LED device. In another embodiment, white light can be generated by incorporating multiple micro LED devices into a pixel, with each micro LED device designed to emit the same emission spectrum (e.g. visible spectrum or UV spectrum), and different wavelength conversion layers designed to convert color emission. In this manner, by including phosphor particles of a single color emission spectrum in each light pipe wavelength conversion layer, secondary absorption of light emitted from different emission spectra of different phosphor particles is avoided. This may increase efficiency and reduce unintended color shift.

Figure 2A:
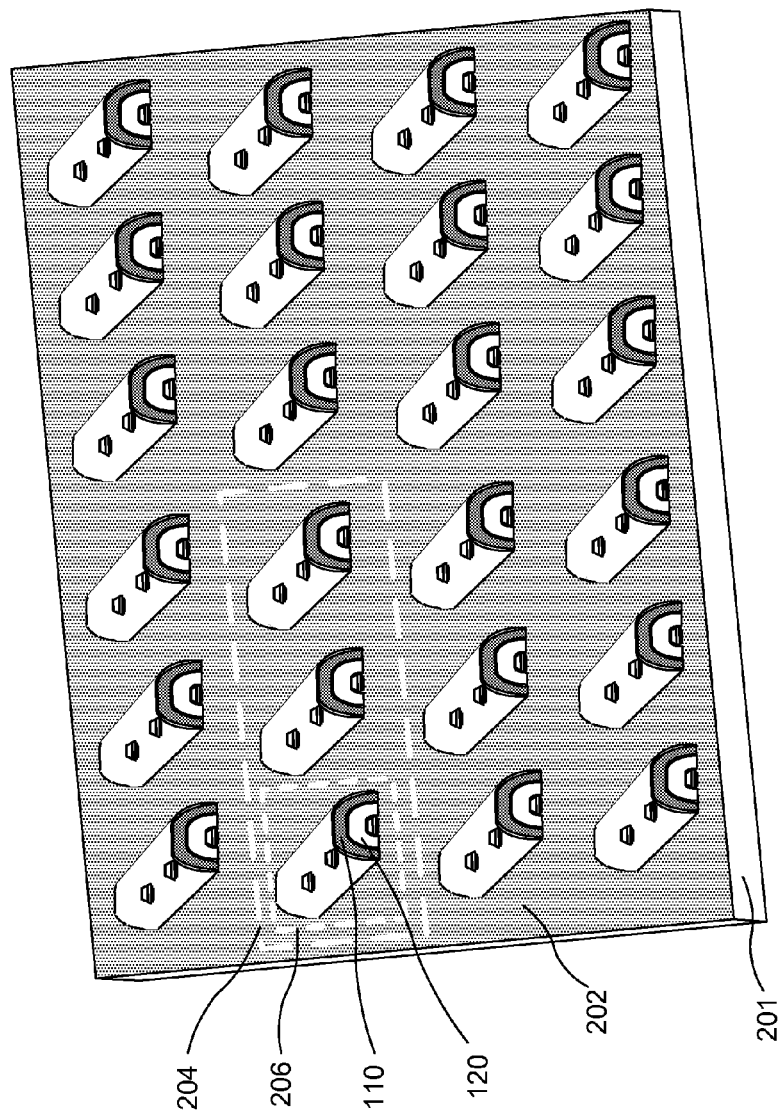
FIG. 2A is a combination view illustration of a light emitting device including a plurality of micro LED devices and a plurality of light pipes and wavelength conversion layers around the plurality of micro LED devices in accordance with an embodiment of the invention.

Referring now to FIG. 2A, a combination view illustration is provided of a light emitting device including a plurality of micro LED devices 100 bonded to a substrate 201, a plurality of light pipes 120 around the plurality of micro LED devices 100, and a plurality of wavelength conversion layers 110 over the plurality of light pipes 120. In the particular embodiment illustrated, a pixel 204 includes a plurality of micro LED devices 100 within light pipes 120 and wavelength conversion layers 110 designed to convert emission, e.g. in an RGB subpixel arrangement. In an embodiment, a black matrix material 202 can be formed over the substrate 201 and between the light pipes 120 to absorb light and prevent color bleeding into adjacent pixels 204 or subpixels 206. Alternatively, the black matrix material 202 can be substituted with a white matrix material to reflect light and prevent color bleeding into adjacent pixels 204 or subpixels.

When arranged in a pixel configuration, each subpixel 206 may contain a single phosphor color emission, where present. Each subpixel may likewise contain a different phosphor color emission, where present. In this manner, secondary absorption of light emitted from a phosphor particle emitting a different spectrum (e.g. absorption of green light emitted from a green emitting phosphor particle by a red emitting phosphor particle) is avoided. This may increase efficiency and reduce unintended color shift. Such pixel and subpixel configurations can be used for the final output of white light, or any other color of light.

For example, a pixel 204 may contain 3 micro LED devices in 3 light pipes, or a plurality of micro LED devices in each light pipe, with all the micro LED devices designed to emit blue light, with one red emitting wavelength conversion layer over one light pipe, one green emitting wavelength conversion layer over a second light pipe, and the third light pipe either not including a wavelength conversion layer over it or including a blue emitting wavelength conversion layer over it. In one embodiment, white light can be generated by incorporating multiple micro LED devices into a pixel, with each micro LED device designed to emit UV light, with one red emitting conversion layer over a first light pipe, one green emitting wavelength conversion layer over a second light pipe, and one blue emitting wavelength conversion layer over a third light pipe. In another embodiment, white light can be generated by incorporating combinations of micro LED devices designed for different emission spectrum and different wavelength conversion layers, or no wavelength conversion layers. In another exemplary embodiment, white light can be generated with a light pipe around a micro LED device designed for red emission with no overlying wavelength conversion layer, a light pipe around a micro LED device designed for blue emission with an overlying wavelength conversion layer designed for green emission, and a light pipe around a micro LED device designed for blue emission with no overlying wavelength conversion layer.

In the above exemplary embodiments, a red-green-blue (RGB) subpixel arrangement is obtained, and each pixel includes three subpixels that emit red, green and blue lights, respectively. It is to be appreciated that the RGB arrangement is exemplary and that embodiments are not so limited. Examples of other subpixel arrangements that can be utilized include, but are not limited to, red-green-blue-yellow (RGBY), red-green-blue-yellow-cyan (RGBYC), or red-green-blue-white (RGBW), or other subpixel matrix schemes where the pixels may have different number of subpixels, such as the displays manufactured under the trademark name PenTile®.

Figure 2B:
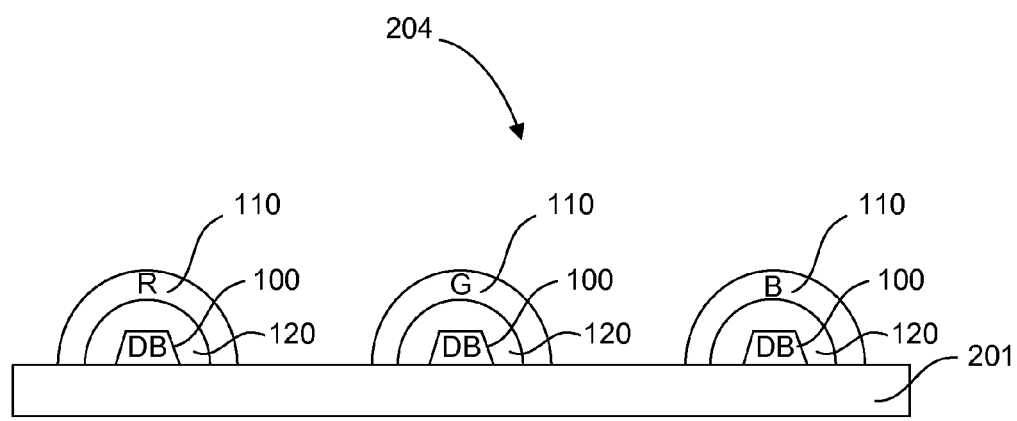
FIG. 2B is a schematic side view illustration of a pixel in accordance with an embodiment of the invention.

FIG. 2B is a schematic side view illustration of a pixel 204 in accordance with an embodiment of the invention. As illustrated in FIG. 2B, each micro LED device 100 is designed to emit a deep blue (DB) color spectrum. In such an embodiment, the different wavelength conversion layers 110 can be designed to emit red (R), green (G), and blue (B) in an RGB subpixel arrangement.

Figure 2C:
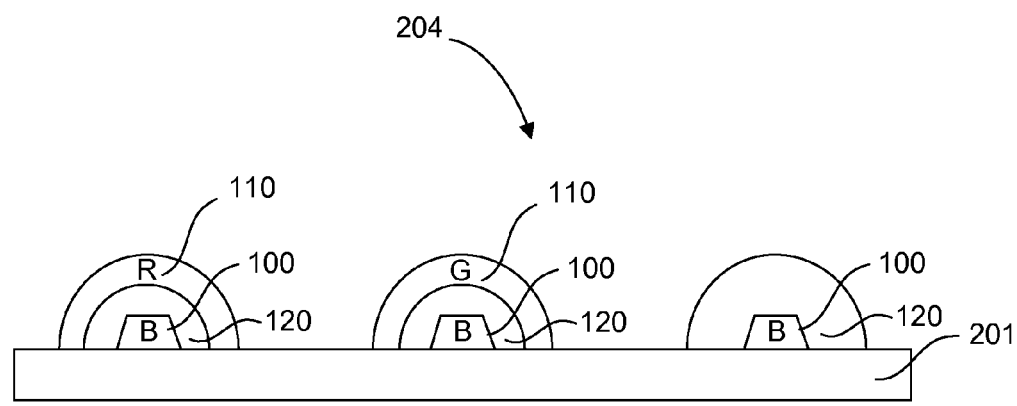
FIG. 2C is a schematic side view illustration of a pixel in accordance with an embodiment of the invention.

FIG. 2C is a schematic side view illustration of a pixel 204 in accordance with an embodiment of the invention. As illustrated in FIG. 2C, each micro LED device 100 is designed to emit a blue (B) color spectrum. In such an embodiment, the different wavelength conversion layers 110 can be designed to emit red (R) and green (G). A wavelength conversion layer 110 is not formed over the third light pipe 120. In this manner an RGB subpixel arrangement is achieved without having to covert the blue light from the blue emitting subpixel. In an embodiment, the third light pipe 120 can be made thicker than the other two light pipes over which wavelength conversion layers 110 are formed in order to achieve similar micro lens characteristics. For example, the thickness of the third light pipe 120 may be similar to the total thickness of the first light pipe 120, and first red wavelength conversion layer 110 (and any intermediate layers).

Figure 2D:
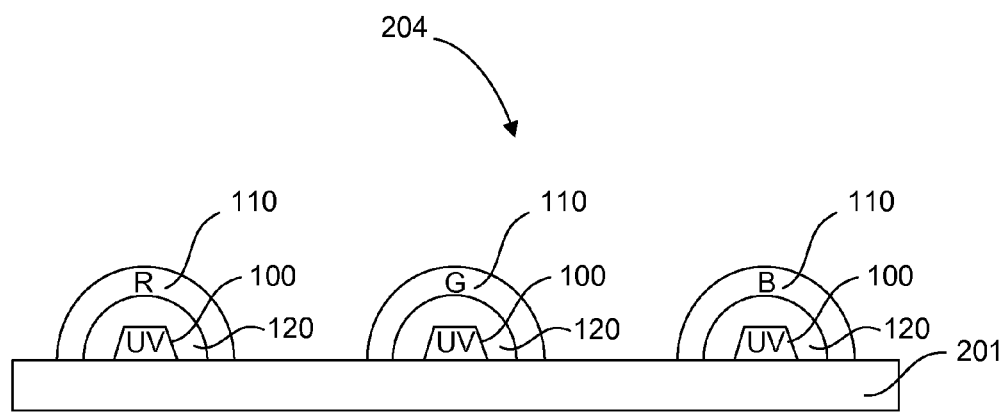
FIG. 2D is a schematic side view illustration of a pixel in accordance with an embodiment of the invention.

FIG. 2D is a schematic side view illustration of a pixel 204 in accordance with an embodiment of the invention. As illustrated in FIG. 2D, each micro LED device 100 is designed to emit an ultraviolet (UV) color spectrum. In such an embodiment, the different wavelength conversion layers 110 can be designed to emit red (R), green (G), and blue (B).

Figure 2E:
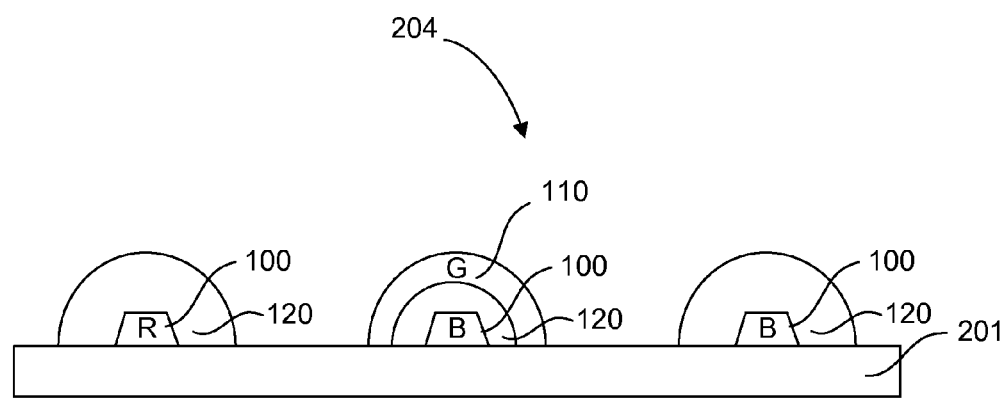
FIG. 2E is a schematic side view illustration of a pixel in accordance with an embodiment of the invention.
Figure 3A:
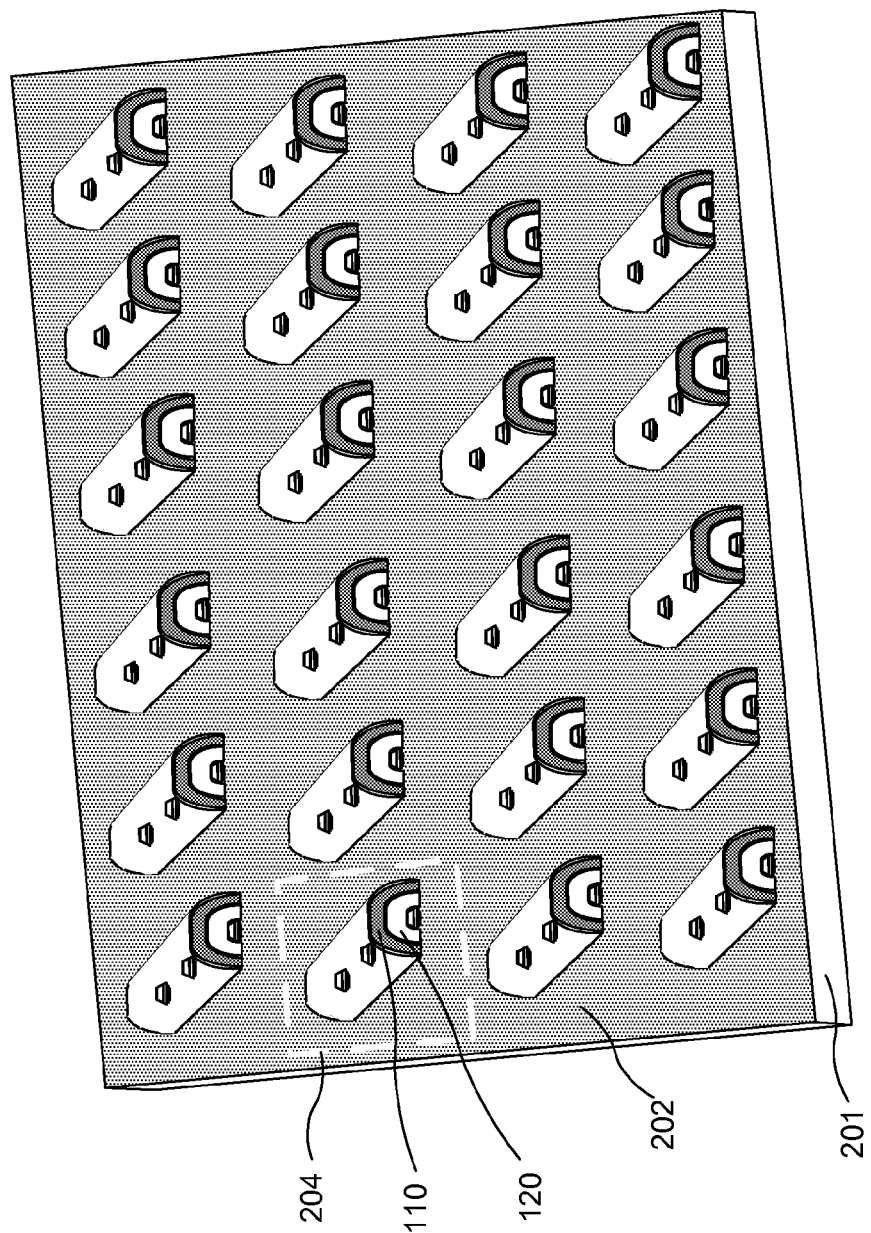
FIG. 3A is a combination view illustration of a light emitting device including a plurality of micro LED devices and a plurality of light pipes and wavelength conversion layers around the plurality of micro LED devices in accordance with an embodiment of the invention.
Figure 3B:
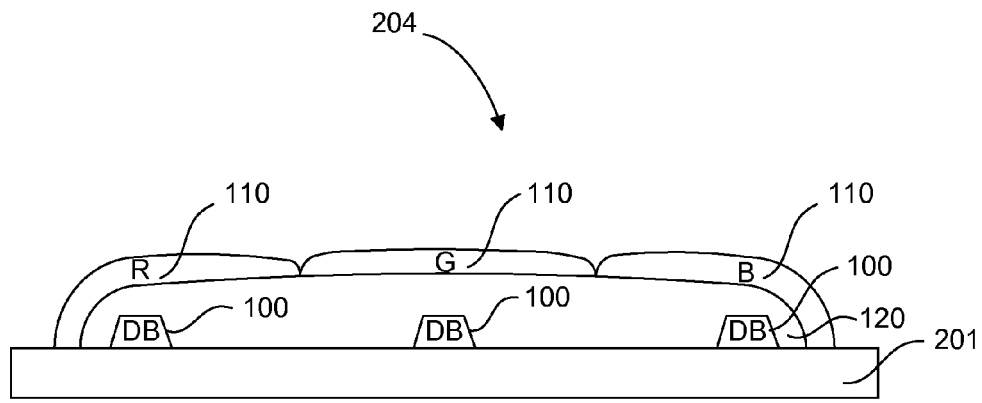
FIG. 3B is a schematic side view illustration of a pixel in accordance with an embodiment of the invention.
Figure 3C:
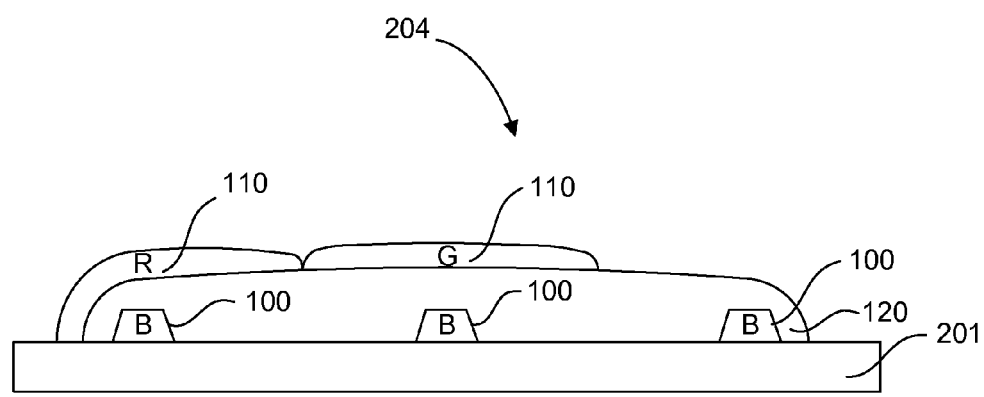
FIG. 3C is a schematic side view illustration of a pixel in accordance with an embodiment of the invention.
Figure 3D:
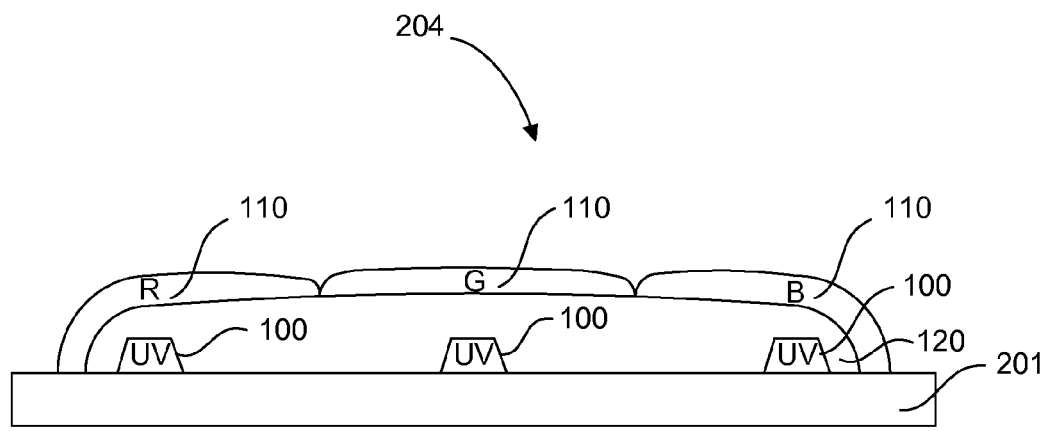
FIG. 3D is a schematic side view illustration of a pixel in accordance with an embodiment of the invention.
Figure 3E:
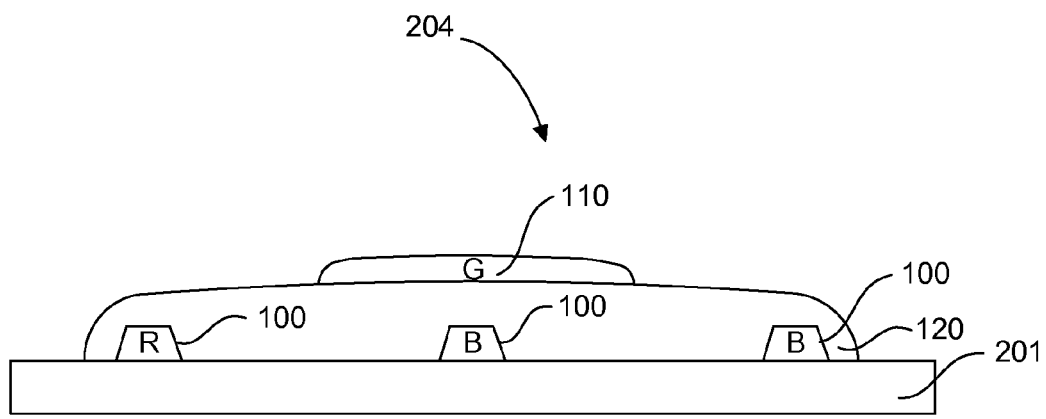
FIG. 3E is a schematic side view illustration of a pixel in accordance with an embodiment of the invention.

FIG. 2E is a schematic side view illustration of a pixel 204 in accordance with an embodiment of the invention. As illustrated in FIG. 2E, the pixel 204 includes micro LED devices 100 designed to emit a red (R) or blue (B) color emission spectrum. As illustrated, a green (G) emitting wavelength conversion layer 110 is formed over one of the light pipes 120 around one of the blue emitting micro LED device 100, and a wavelength conversion layer 110 is not required to be formed over the light pipes 120 formed around the red emitting micro LED device or the other blue emitting micro LED device. Such a configuration may be implemented, for example, when it is possible to fabricate and integrate blue emitting and red emitting micro LED devices that are more efficient than green emitting micro LED devices. In such an embodiment, it may be more efficient to convert blue light to green light with a wavelength conversion layer. Such a configuration may also be useful when providing a broad spectrum at the visual response peak, around 555 nm. Such a configuration may allow for controlling the correlated control temperature (CCT) of the light emitting device, and hence controlling the warmth, by driving the red emitting micro LED device independently. Such a configuration may also be useful for obtaining a good color rendering index (CRI) with the broad emission spectrum from the green wavelength conversion layer 110, while using efficient blue emitting micro LED devices and a red emitting LED device which can increase the CRI R9 without decreasing efficiency. As described above with regard to FIG. 2C, the light pipes 120 formed around the red emitting micro LED device or the other blue emitting micro LED device in FIG. 2E may be made thicker than the other light pipe over which a wavelength conversion layer is formed in order to achieve similar micro lens characteristics.

Referring now to FIGS. 3A-3E various pixel configurations are illustrated similar to those illustrated and described above with regard to FIGS. 2A-2E with one difference being that each light pipe 120 spans across multiple subpixels within a pixel 204. For example, the embodiment illustrated in FIG. 3A may be an exemplary RGB subpixel arrangement in which a light pipe 120 is formed around a micro LED device in each subpixel of the pixel 204, however, other subpixel arrangements are possible such as, but not limited to RGBY, RGBYC, RGBW, or others. In such arrangements the light pipe spanning across multiple subpixels within a pixel allows for color mixing between subpixels. Such a configuration may be used in applications where the micro LED devices or subpixels are far enough apart that they could otherwise be perceived by the human eye (e.g. approximately 100 μm or more) and perceived as small dots. The color mixing associated with the light pipe configurations of FIGS. 3A-3E may be used to blend the micro LED device emissions so that they are not perceived by the human eye. One possible application may be in a heads up display where the viewing distance is short, and it is more likely that the viewer is to be capable of perceiving emission spectra from individual subpixels or micro LED devices.

Referring to FIGS. 3B-3E, the arrangements of emission spectra for the micro LED devices 100 and wavelength conversion layers 110 is similar to that of FIGS. 2B-2E, with one difference being that the wavelength conversion layers 110 are formed over only specific portions of the light pipe 120 shared by the micro LED devices 100 in the pixel 204. Additional modifications can also be incorporated into the configurations illustrated in FIGS. 3B-3E. The profile of the light pipe 120 can be altered over certain micro LED devices 100. For example, the light pipe 120 can be made thicker over "naked" micro LED devices 100 over which a wavelength conversion layer 110 is not formed. The light pipes 120 of FIGS. 2A-3E can also be tapered, for example, as previously described with regard to FIGS. 1E-1F.

Figure 4A:
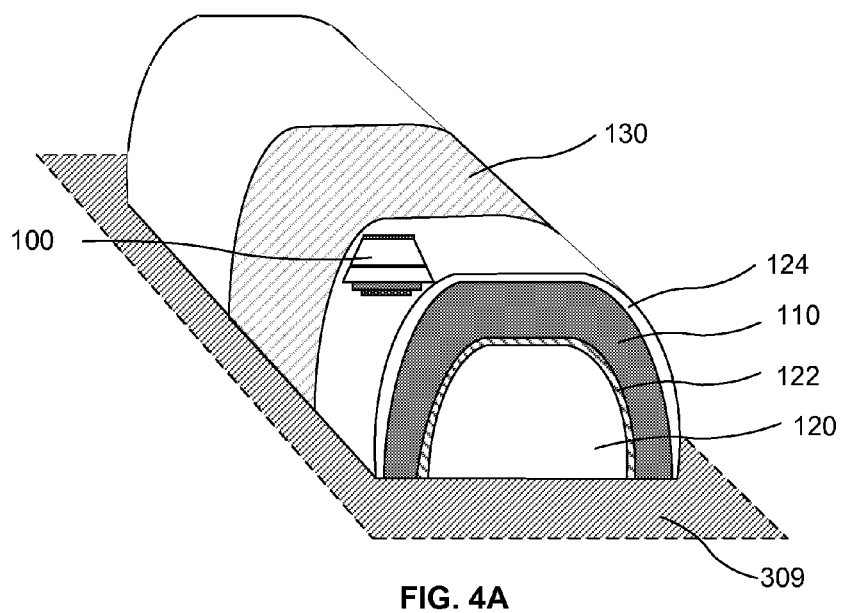
FIG. 4A is combination view illustration of a light pipe around a micro LED device and a reflective layer over the light pipe in accordance with an embodiment of the invention.
Figure 4B:
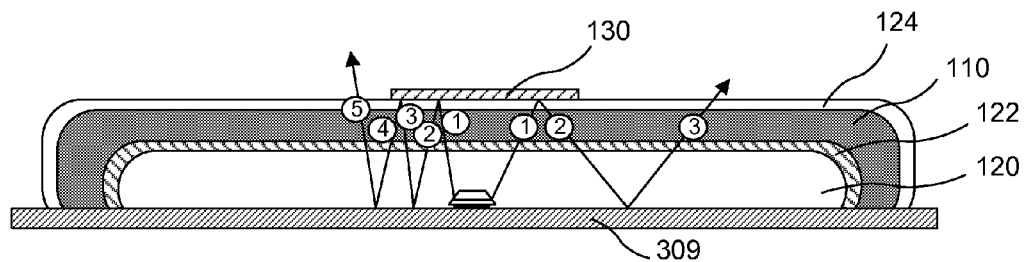
FIG. 4B is a cross-sectional side view illustration of a reflective layer over a wavelength conversion layer and light pipe in accordance with an embodiment of the invention.
Figure 4C:
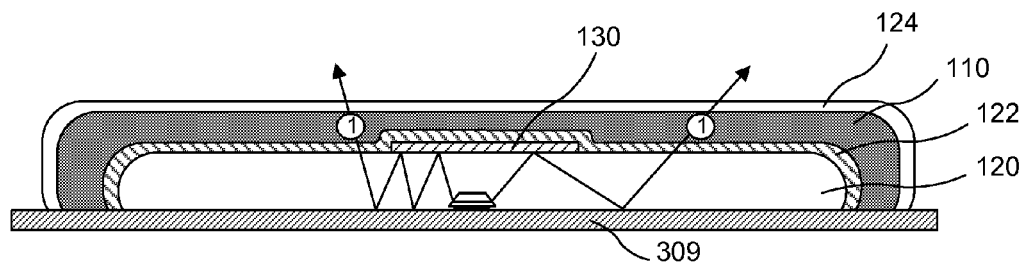
FIG. 4C is a cross-sectional side view illustration of a reflective layer over a light pipe and underneath a wavelength conversion layer in accordance with an embodiment of the invention.

Referring now to FIGS. 4A-4C, combination and cross-sectional side view illustrations are provided for embodiments including a reflective layer 130 over the light pipe 120. In an embodiment, the reflective layer 130 may be formed directly over the micro LED device 100. Reflective layer 130 can be provided in different locations, which may result in different effects on the light pipe and wavelength conversion layer configuration. In one embodiment illustrated in FIG. 4B a reflective layer 130 is formed over the wavelength conversion layer 110. In this manner, the reflective layer can block incident light emitted from the micro LED device 100 from bleeding through the wavelength conversion layer 110 at the closest location to the micro LED device, where optical intensity may be the greatest. Reflection of the incident light can also have the effect of laterally spreading the light thereby improving the fill factor. Another effect of the reflective layer 130 may also be to increase the number of passes of the incident light through the wavelength conversion layer. By way of example, two situations are illustrated where the incident light passes through the wavelength conversion layer 110 three times and five times. With each pass, phosphor particles are excited and emit converted spectra. In this manner, the efficiency of the phosphor particles in the wavelength conversion layer 110 can be improved, thereby increasing the converted spectra light intensity of the system, improving the fill factor, and reducing the quantity of phosphor needed.

In another embodiment illustrated in FIG. 4C a reflective layer 130 is formed between the light pipe 120 and the wavelength conversion layer 110. In such a configuration, the reflective layer may influence lateral spreading of incident light, and improve the fill factor. Such a configuration may also block incident light from entering the wavelength conversion layer 110 at the closest location to the micro LED device, where optical intensity may be the greatest. As such, bleeding of incident light through the wavelength conversion layer 110 can be reduced. This configuration may also increase the lifetime of the phosphor particles, particularly where optical intensity would have been the greatest.

Figure 5A:
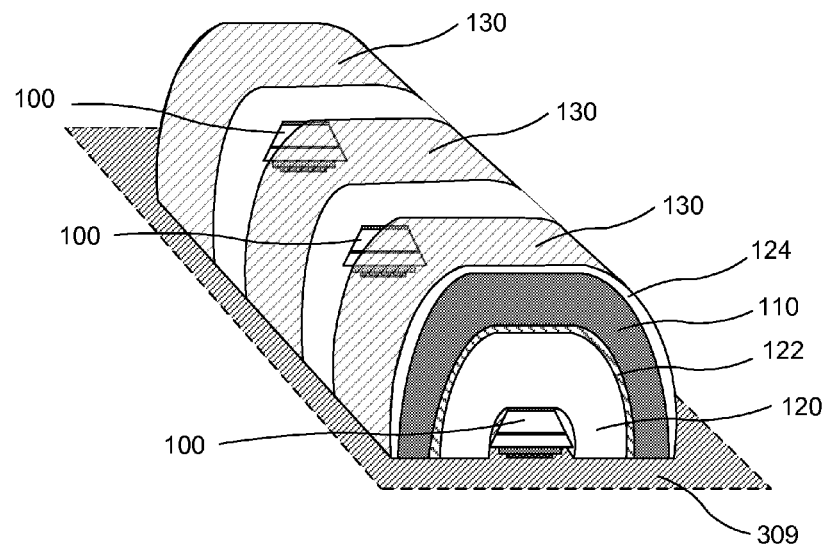
FIG. 5A is combination view illustration of a light pipe around a plurality of micro LED devices and a plurality of reflective layers over the light pipe in accordance with an embodiment of the invention.
Figure 5B:
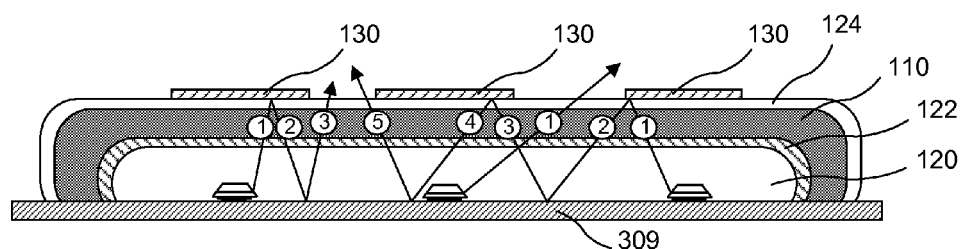
FIG. 5B is a cross-sectional side view illustration of a plurality of reflective layers over a wavelength conversion layer and light pipe in accordance with an embodiment of the invention.
Figure 5C:
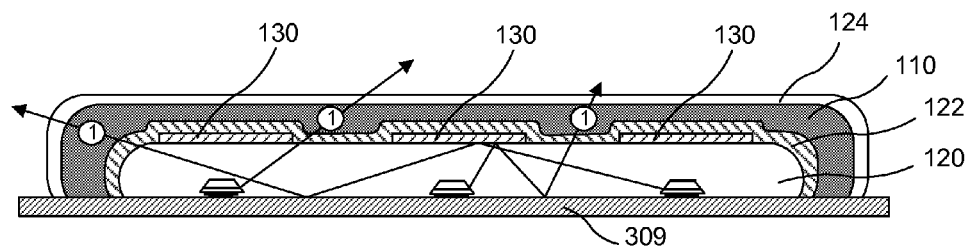
FIG. 5C is a cross-sectional side view illustration of a plurality of reflective layers over a light pipe and underneath a wavelength conversion layer in accordance with an embodiment of the invention.

FIGS. 5A-5C illustrate embodiments similar to those illustrated and described with regard to FIGS. 4A-4C. In the embodiments illustrated in FIGS. 5A-5C, the light pipes 120 are formed around a plurality of micro LED devices 100, and reflective layers 130 are formed directly over the micro LED devices. While embodiments are illustrated including three micro LED devices 100 per light pipe, it is to be appreciated that this is exemplary and any number of micro LED devices 100 can be located within each light pipe.

The reflective layers 130 described above and illustrated in FIGS. 4A-5C are illustrated as being flat layers. However, it is not required that the reflective layers 130 are flat. Any configuration is possible, and the reflective layers 130 may be shaped to control the direction of light emission. Reflective layers 130 also are not required to be formed directly above the micro LED devices, and may be formed at other locations such as along the lateral edges of the light pipe or wavelength conversion layer.

Figure 6A:
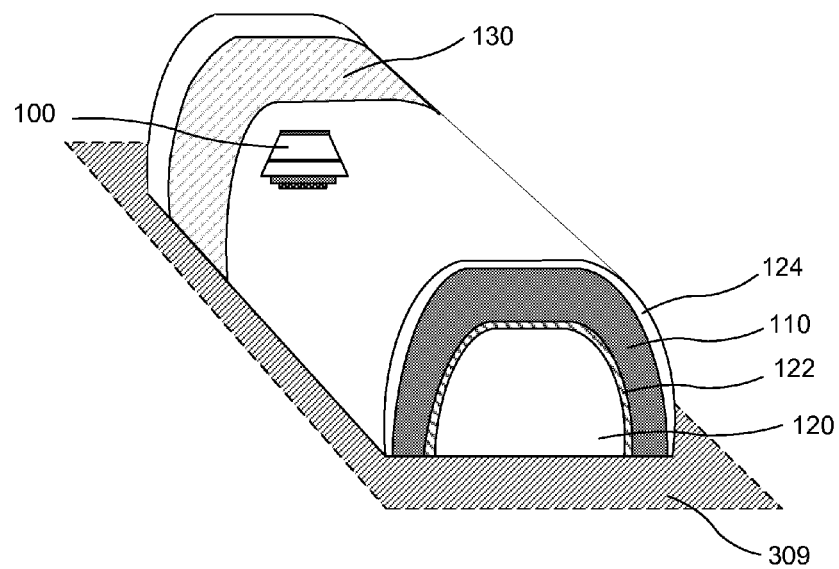
FIG. 6A is combination view illustration of a light pipe around a micro LED device and a reflective layer and plurality of wavelength conversion layers over the light pipe in accordance with an embodiment of the invention.
Figure 6B:
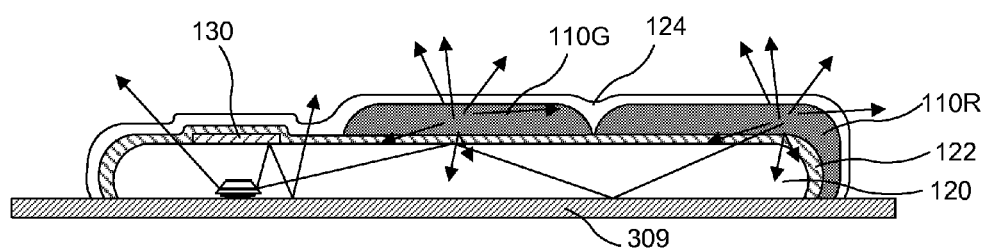
FIGS. 6B-6C are cross-sectional side view illustrations of a reflective layer and a plurality of wavelength conversion layers over the light pipe in accordance with embodiments of the invention.
Figure 6C:
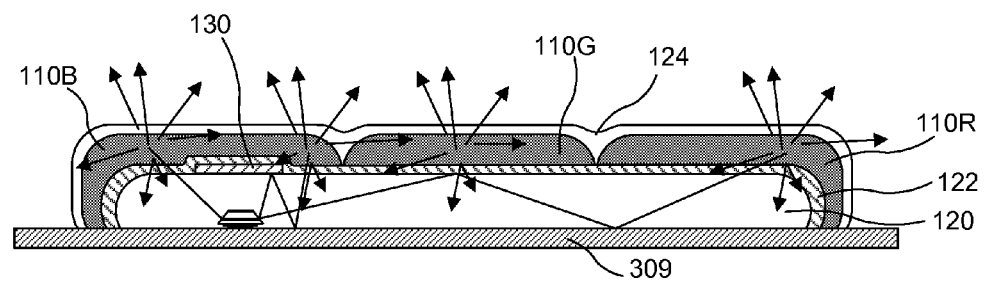

Referring now to FIGS. 6A-6C, combination and cross-sectional side view illustrations are provided for embodiments including a reflective layer 130 and a plurality of wavelength conversion layers over the light pipe 120 in accordance with embodiments of the invention. For example, these configurations can be used in a pixel design including a single light pipe spanning multiple subpixels in the pixel. In the particular embodiments illustrated, the light pipe configuration is an RGB configuration. As illustrated in FIG. 6B, a mirror layer 130 is formed over the light pipe 120 over the micro LED device, and a green emitting wavelength conversion layer 110G and red emitting wavelength conversion layer 110R are formed over the light pipe 120 along the lateral length of the light pipe. As illustrated in FIG. 6C, a minor layer 130 is formed over the light pipe 120 and underneath a blue emitting wavelength conversion layer 110B, with wavelength conversion layers 110G, 110R being formed similarly as with FIG. 6B. The particular embodiments illustrated in FIGS. 6A-6C are exemplary in nature, and represent only one manner for integrating a light pipe over multiple subpixel areas of a pixel.

In accordance with embodiments of the invention, the light emitting device configuration including the micro LED device, light pipe, and wavelength conversion layer can be incorporated into a variety of lighting or display devices. Exemplary lighting applications include interior or exterior lighting applications, such as billboard lighting, building lighting, street lighting, panel lighting, light bulbs, and lamps. Exemplary display applications include passive matrix display and active matrix displays, such as, display signage, display panels, televisions, tablets, phones, laptops, computer monitors, kiosks, digital cameras, handheld game consoles, media displays, ebook displays, or large area signage display.

Figure 7A:
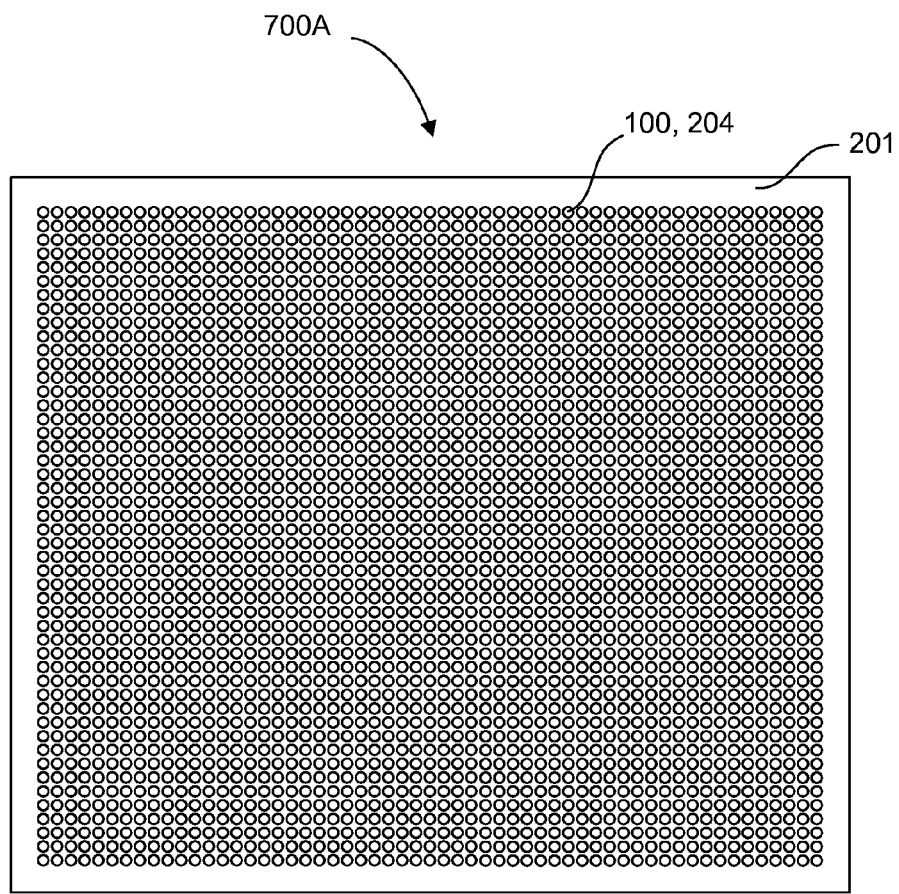
FIGS. 7A-7B are schematic top view illustrations of light emitting devices including a plurality of micro LED devices in light pipes, or alternatively pixels of micro LED devices in light pipes, in accordance with embodiments of the invention.
Figure 7B:
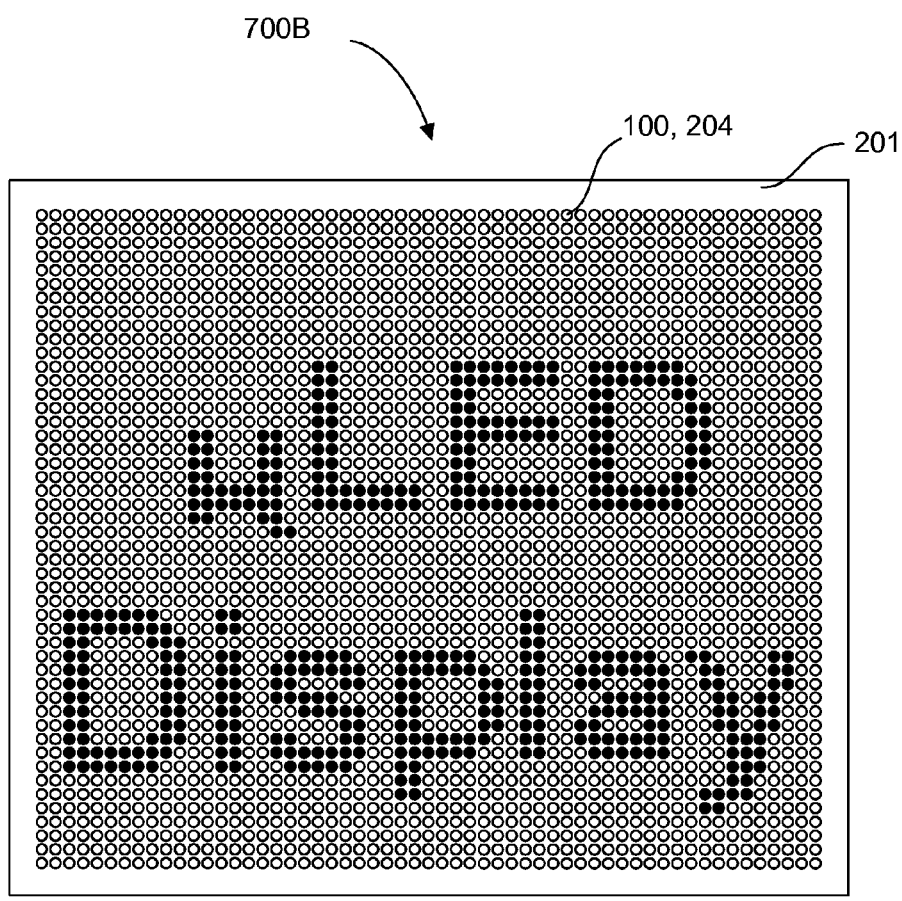

Referring now to FIGS. 7A-7B, schematic top view illustrations are provided of light emitting devices including a plurality of micro LED devices 100, or alternatively pixels 204 of micro LED devices, arranged with light pipes and wavelength conversion layers for controlling the light emission spectrum. In one embodiment, the light emitting device may be a lighting device 700A. For example, each of the micro LED devices 100 or pixels 204 can be addressed together. Alternatively, subsets of the pixels can be addressed together. For example, blue emitting subpixels can be addressed together, while red subpixels can be addressed together, and green emitting subpixels can be addressed together. In another example, different regions or shapes of micro LED devices 100 or pixels 204 can be addressed separately. In another embodiment, each micro LED device, subpixel, or pixel can be selectively addressed. Referring to FIG. 7B, such a configuration can also be used for a micro LED display 700B. Any arrangement of light emitting devices may be made in accordance with embodiments of the invention. For example, the micro LED devices can be arranged in arrays or irregular patterns for illumination. Each micro LED device may be simultaneously addressed, or selectively addressed depending upon application.

In the following description, specific examples are described and illustrated for integrating micro LED devices with wavelength conversion layers into lighting or display devices. It is to be appreciated, however, that the following embodiments are exemplary and are not intended to exclusive of one another, and that the following embodiments may be combined in certain situations.

Figure 8A:
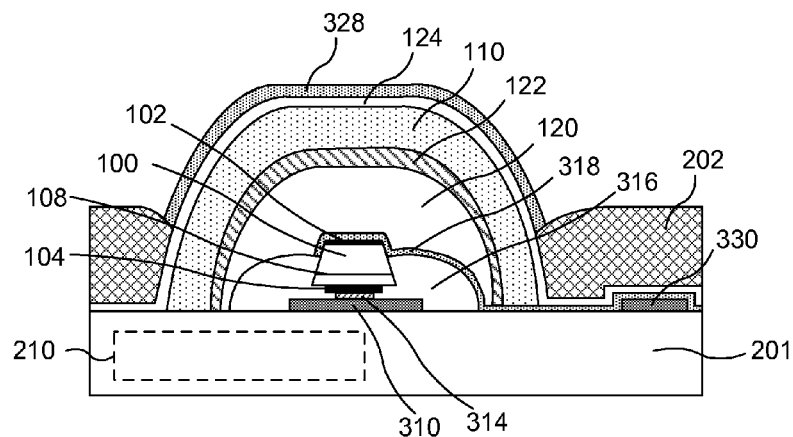
FIGS. 8A-8B are cross-sectional side view illustrations of a light pipe around a micro LED device with top and bottom contacts and a wavelength conversion layer over the light pipe in accordance with embodiments of the invention.

Referring now to FIGS. 8A-9F, various configurations for bonding one or more micro LED devices onto a substrate 201 are described. FIGS. 8A-8B are cross-sectional side view illustrations of a light pipe around a micro LED device and a wavelength conversion layer over the light pipe in accordance with embodiments of the invention, with FIG. 8B illustrating an elongated lateral length of a light pipe that is greater than a thickness of the light pipe. In the particular embodiments illustrated in FIGS. 8A-8B the micro LED devices 100 are vertical micro LED devices including top and bottom contacts 102, 104.

In an embodiment one or more micro LED devices 100 are bonded to a bottom electrode 310 on or within a substrate 201. The micro LED devices 100 can be transferred and bonded to the substrate 201 as part of an array of micro LED devices 100 using a variety of techniques including a transfer bonding process, transfer using elastomeric stamps, or transfer and bonding using an electrostatic transfer head array, as described in any of U.S. Pat. No. 8,333,860, U.S. Pat. No. 8,349,116, U.S. Pat. No. 8,415,771, U.S. Pat. No. 8,415,767, or U.S. Pat. No. 8,415,768.

Substrate 201 may be a variety of substrates such as, but not limited to, a display substrate, a lighting substrate, a substrate with functional devices such as transistors or integrated circuits (ICs), or a substrate with metal redistribution lines. Depending upon the particular application, substrate 201 may be opaque, transparent, or semi-transparent to the visible wavelength spectrum (e.g. 380-750 nm wavelength), and substrate 201 may be rigid or flexible. For example, substrate 201 may be formed of glass, metal foil, metal foil covered with dielectric, or a polymer such as polyethylene terephthalate (PET), polyethylene naphthalate (PEN), polycarbonate (PC), polyethersulphone (PES), aromatic fluorine-containing polyarylates (PAR), polycyclic olefin (PCO), and polyimide (PI). In an embodiment, the substrate 201 includes working circuitry 210. For example substrate 201 may be an active matrix backplane including working circuitry 210 such as a driving transistor, switching transistor, and capacitor. In an embodiment, substrate 201 is a thin film transistor (TFT) substrate including working circuitry 210.

Conductive electrodes or electrode lines 310, 330 can be formed on, within, or over substrate 201. For example, the electrodes or electrode lines 310, 330 function as an anode, cathode, or ground, or an electrical line to anode, cathode, or ground. In interests of clarity, 310 is referred to as a bottom electrode or electrode line and 330 is referred to as a ground line in the remainder of the description. However, it is to be appreciated that this is one embodiment, and other configurations are possible. While the remainder of the description is made with regard to this designation, it is understood that this is not the sole embodiment.

Bottom electrode 310 and ground line 330 can be formed of a variety of materials, and either may be opaque, transparent, or semi-transparent to the visible wavelength spectrum. Exemplary transparent conductive materials include amorphous silicon, transparent conductive oxides (TCO) such as indium-tin-oxide (ITO) and indium-zinc-oxide (IZO), carbon nanotube film, or a transparent conducting polymer such as poly(3,4-ethylenedioxythiophene) (PEDOT), polyaniline, polyacetylene, polypyrrole, and polythiophene. In an embodiment bottom electrode 310 is approximately 100 nm-200 nm thick ITO. In an embodiment, the bottom electrode 310 includes nanoparticles such as silver, gold, aluminum, molybdenum, titanium, tungsten, ITO, and IZO. The bottom electrode 310 or ground line 330 may also be reflective to the visible wavelength. In an embodiment, a bottom electrode 310 or ground line 330 comprises a reflective metallic film such as aluminum, molybdenum, titanium, titanium-tungsten, silver, or gold, or alloys thereof.

A bonding layer 314 may optionally be formed between the micro LED device 100 and the bottom electrode 310 to facilitate bonding of the bottom contact 104 of micro LED device 100 to the bottom electrode 310 on substrate 201. In an embodiment, bonding layer 314 includes a material such as indium, gold, silver, molybdenum, tin, aluminum, silicon, or an alloy or alloys thereof.

Figure 8B:
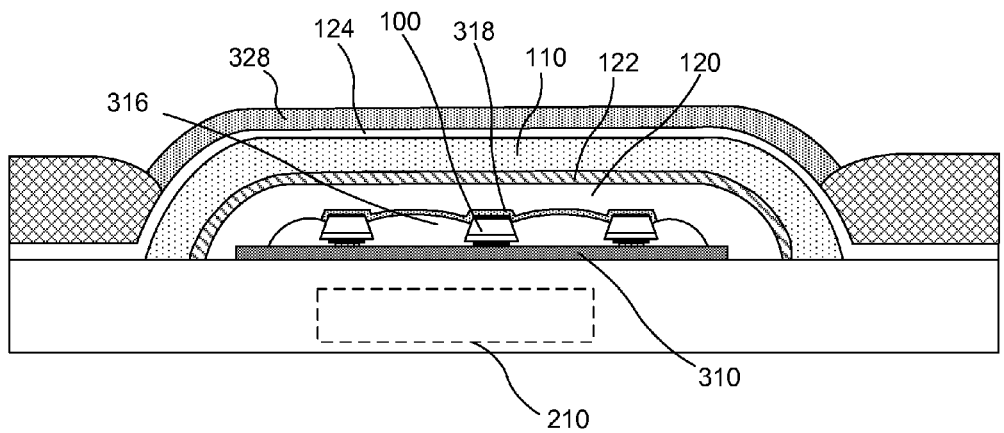

Still referring to FIGS. 8A-8B, a sidewall passivation layer 316 can be formed around the sidewalls of the micro LED devices 100. In an embodiment where the micro LED devices 100 are vertical LED devices, the sidewall passivation layer 316 covers and spans the quantum well structure 108. In accordance with embodiments of the invention, the sidewall passivation layer 316 may be transparent or semi-transparent to the visible wavelength spectrum so as to not significantly degrade light extraction efficiency from sidewalls of the micro LED devices 100. Sidewall passivation layer 316 may be formed of a variety of materials such as, but not limited to epoxy, silicone, acrylic, poly(methyl methacrylate) (PMMA), benzocyclobutene (BCB), polyimide, and polyester. In an embodiment, sidewall passivation layer 316 is formed by ink jet printing around the light emitting devices 100, followed by curing. In an embodiment, sidewall passivation layer 316 is cured with ultraviolet (UV) light to minimize volume change as a result of cure and protect the integrity of the bond between the micro LED device and the bottom electrode, though thermal curing may also be performed. Sidewall passivation layer 316 can also be deposited using other techniques such as slit coating, physical vapor deposition or chemical vapor deposition of a dielectric material such as a nitride or oxide, spin on technique such as a spin on glass, or spray coating followed by solvent evaporation. In an embodiment, sidewall passivation layer is an a-staged or b-staged coating already formed over the substrate 201 prior to bonding the micro LED devices 100 when the micro LED devices punch through the coating during the transfer and bonding operations, and the coating is then cured after bonding of the micro LED devices 100.

In an embodiment the sidewall passivation layer 316 at least partially covers the bottom electrode 310. The sidewall passivation layer may completely cover the bottom electrode 310, however, this is not required. Any combination of other insulating layers can be used to electrically insulate the bottom electrode 310 from other electrically conductive layers. For example, insulating layer 317 can be deposited over edges of the reflective bank structure 142. In accordance with embodiments of the invention, a sidewall passivation layer 316 may not be required where a conformal dielectric barrier layer 107 is present along sidewalls of the micro LED devices 100. Alternatively, a sidewall passivation layer 316 may be formed in combination with an existing conformal dielectric barrier layer 107.

In embodiments including a vertical micro LED device, following the formation of optional sidewall passivation layer 316, a top electrode layer 318 is formed on the micro LED device 100 and in electrical contact with the top contact 102 and ground line 330. Depending upon the particular application, top electrode layer 318 may be opaque, reflective, transparent, or semi-transparent to the visible wavelength. Exemplary transparent conductive materials include amorphous silicon, transparent conductive oxides (TCO) such as indium-tin-oxide (ITO) and indium-zinc-oxide (IZO), carbon nanotube film, or a transparent conductive polymer such as poly (3,4-ethylenedioxythiophene) (PEDOT), polyaniline, polyacetylene, polypyrrole, and polythiophene. In an embodiment top electrode layer 318 is approximately 50 nm-1 μm thick ITO-silver-ITO stack, with the silver layer thin enough to be transparent to the visible wavelength spectrum. In a particular embodiment, the top electrode layer 318 is formed by ink jet printing. In an embodiment top electrode layer 318 is approximately 50 nm-1 μm thick PEDOT. Other methods of formation may include chemical vapor deposition (CVD), physical vapor deposition (PVD), or spin coating depending upon the desired area to be coated and any thermal constraints. In accordance with embodiments of the present invention, the top electrode layer 318 may be formed over a plurality of the micro LED devices 100 on substrate 201, electrically connecting the plurality of the micro LED devices 100 to ground line 330.

A light pipe 120, optional matching layer 122, wavelength conversion layer 110, and optional barrier layer 124 may then be formed as described above with regard to FIG. 1A. Still referring to the embodiment illustrated in FIGS. 8A-8B the light pipe is illustrated as being wider (FIG. 8A) and longer (FIG. 8B) than the bottom electrode 310. However, this is not required. Referring again to the embodiment illustrated in FIG. 1A, the reflective layer 309, which can be a bottom electrode 310 or reflective bank structure is illustrated as being wider and longer than both the light pipe 120 and wavelength distribution layer 110. In some embodiments, the reflective layer 309 or bottom electrode 310 can be formed underneath all or some of the micro LED devices 100 on substrate 201. In one embodiment, the reflective layer 309 or bottom electrode layer 310 is not wider (FIG. 8A) or longer (FIG. 8B) than the wavelength distribution layer 110 so that light that passes through the light pipe 120 also passes through the wavelength distribution layer 110, and color bleeding is prevented.

Referring briefly back to FIG. 2A a black matrix (or alternatively white matrix) material 202 is illustrated between the micro LED devices 100 and light pipes 120 in order to block light transmission, and to separate bleeding of light between adjacent micro LED devices 100. Black (or white) matrix 202 can be formed from a method that is appropriate based upon the material used, and composition of layers already formed. Manner of formation may also be determined by whether the black (or white) matrix is formed in a single side manner (see FIG. 10) or a top press down manner (see FIG. 11). For example, black (or white) matrix 202 can be applied using ink jet printing, sputter and etching, spin coating with lift-off, or a printing method. In some embodiments, black (or white) matrix 202 is formed by ink jet printing and UV cured in order to not thermally degrade the phosphor particles in a wavelength conversion layer 110 already formed. Exemplary black matrix materials include carbon, metal films (e.g. nickel, aluminum, molybdenum, and alloys thereof), metal oxide films (e.g. chromium oxide), and metal nitride films (e.g. chromium nitride), organic resins, glass pastes, and resins or pastes including a black pigment or silver particles. Exemplary white matrix materials include metal particles or $TiO_2$ particles loaded win a polymer, organic resin, or glass paste, for example. In the embodiments illustrated in FIGS. 6A-8, a black (or white) matrix 202 is formed on the substrate 201 in a single side manner—prior to forming a cover over the light emitting device. In the embodiment illustrated in FIG. 9, the black (or white) matrix material can be formed in a top press down manner—in which the black (or white) matrix is formed on the cover prior attaching to the substrate 201.

Referring again to FIGS. 8A-8B a color filter layer 328 may optionally be formed over the wavelength conversion layer 110 to filter out colors emitting through the wavelength conversion layer 110 other than those desired and to sharpen the emission spectrum of the light emitting device. By way of example, a red color filter layer 328 may be placed over a wavelength conversion layer 110 including red emitting phosphor particles in order to filter out colors other than red, a green color filter layer 328 may be placed over a wavelength conversion layer 110 including green emitting phosphor particles in order to filter out colors other than green, and a blue color filter layer 328 may be placed over a wavelength conversion layer 110 including blue emitting phosphor particles in order to filter out colors other than blue. Referring back to FIG. 2B, in an embodiment, a blue color filer may not be necessary over a blue wavelength conversion layer 110 wherein the underlying micro LED device 100 is deep blue emitting. Referring back to FIG. 2C, in an embodiment, a blue color filer may not be necessary over naked (e.g. no wavelength conversion layer) blue emitting underlying micro LED device 100. It is to be appreciated that these configurations are exemplary and a variety of configurations are possible depending upon desired light emission spectrum. Suitable materials for the color filter include pigments or dyes as previously described above. In an embodiment, color filter layer 328 includes a pigment or dye dispersed in a transparent matrix material. In an embodiment, the matrix material is the same polymer used for the wavelength conversion layer 110, such as epoxy, silicone, or acrylic. Likewise, the color filter may be formed using similar techniques, such as ink jet printing with UV cure. In an embodiment, the wavelength conversion layer 110 has an index of refraction within 0.3, or more particularly within 0.1, of the index of refraction for the wavelength conversion layer 110. In the embodiments illustrated in FIGS. 8A-8B the color filter layer 328 is formed after the black matrix 202. In other embodiments, the color filter layer 328 is formed before the black matrix 202.

Figure 8C:
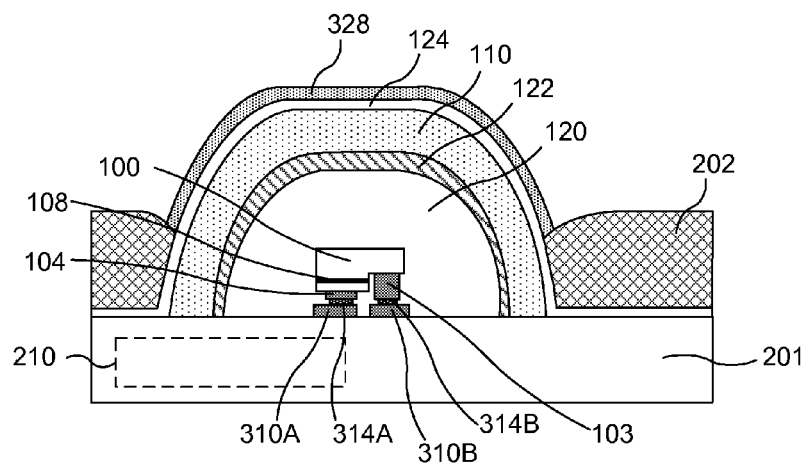
FIGS. 8C-8D are cross-sectional side view illustrations of a light pipe around a micro LED device with bottom contacts and a wavelength conversion layer over the light pipe in accordance with embodiments of the invention.
Figure 8D:
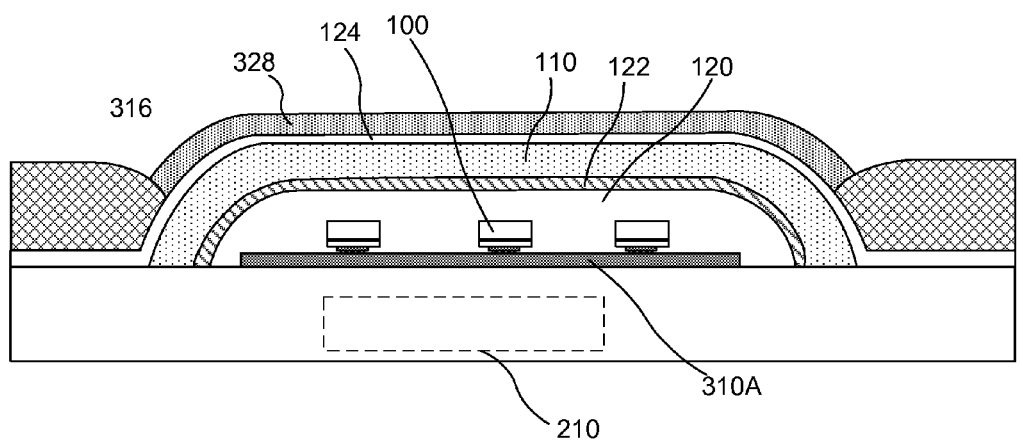

FIGS. 8C-8D are cross-sectional side view illustrations of a light pipe around a micro LED device with bottom contacts and a wavelength conversion layer over the light pipe in accordance with embodiments of the invention. FIGS. 8C-8D are similar to those of FIGS. 8A-8B with one difference being that the micro LED devices 100 include bottom contacts 104, 103 rather than both a bottom and top contact. As a result, it may not be required to form a top electrode layer to contact the ground line 330. Sidewall passivation layer 316 also may be omitted, and the light pipe 120 or other layers can electrically insulate the bottom electrodes 310A, 310B and quantum well structure 108. As illustrated, bottom electrodes 310A, 310B are electrically insulated from one another, and may resemble the configuration of the bottom reflective layers 309A, 309B in FIG. 1B.

Figure 9A:
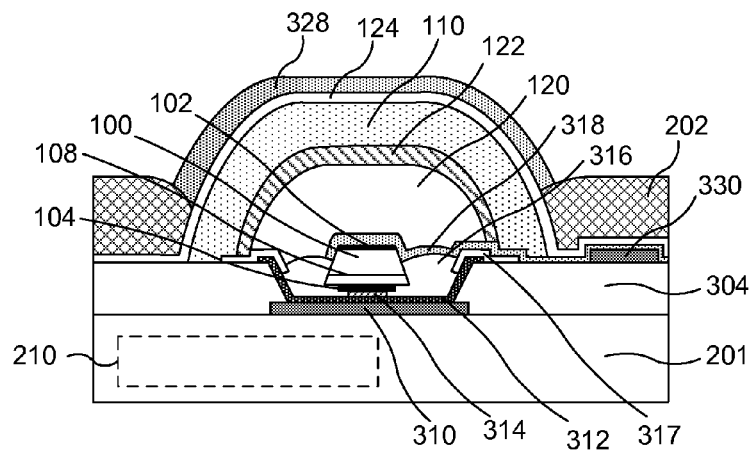
FIGS. 9A-9B are cross-sectional side view illustrations of a light pipe around a plurality of micro LED devices with top and bottom contacts within a reflective bank structure, and a wavelength conversion layer over the light pipe in accordance with embodiments of the invention.
Figure 9B:
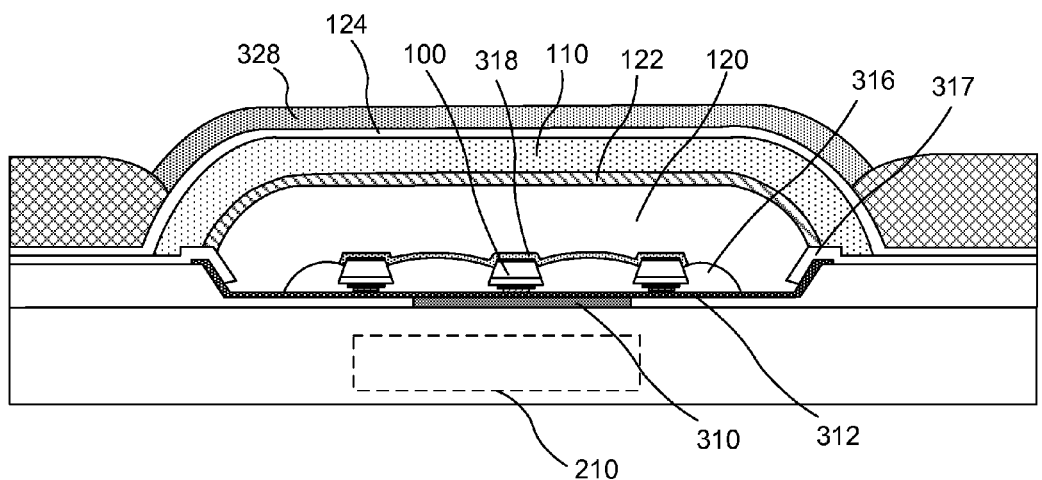

FIGS. 9A-9B are cross-sectional side view illustrations of a light pipe around a micro LED device within a reflective bank structure, and a wavelength conversion layer over the light pipe in accordance with embodiments of the invention, with FIG. 9B illustrating an elongated lateral length of a light pipe that is greater than a thickness of the light pipe. In such an embodiment, a patterned bank layer 304 can be formed over the substrate, and a reflective layer 312 formed within the openings and along sidewalls of the openings of the patterned bank layer 304. In this manner, light emitting laterally from the micro LED devices 100 and through the light pipe 120 can be reflected out and through the layers designed to tailor color emission (e.g. 110, 328) rather than being absorbed by the black matrix 202 or other layers. In addition, back reflection of light from overlying layers such as the wavelength conversion layer 110 is not absorbed by the substrate and instead reflected out of the light emitting device. The patterned reflective layer may additionally increase efficiency of the phosphor particles, since they emit light in all directions, light that is emitted downward can be reflected out of the light emitting device. In an embodiment, top contact 102 includes a reflective layer. Where top contact 102 is reflective, light emission from the micro LED device 100 will become largely dependent upon sidewall emission. A reflective top contact 102 may additionally reduce the amount of back reflection of light from overlying layers that is absorbed by the micro LED device. In addition, the reflective top contact 102 may increase efficiency of the phosphor particles, since they emit light in all directions, light that is emitted downward can be reflected out of the light emitting device.

In an embodiment, patterned bank layer 304 is formed of an insulating material and may be formed by a variety of techniques such as lamination, spin coating, CVD, and PVD. Patterned bank layer 304 may be may be opaque, transparent, or semi-transparent to the visible wavelength. Patterned bank layer 304 may be formed of a variety of materials such as, but not limited to, photodefinable acrylic, photoresist, silicon oxide ($SiO_2$), silicon nitride ($SiN_x$), poly(methyl methacrylate) (PMMA), benzocyclobutene (BCB), polyimide, acrylate, epoxy, and polyester. In an embodiment, patterned bank layer is formed of an opaque material such as a black matrix material. The patterned bank layer openings may be formed using a suitable technique such as lithography, and may expose the bottom electrode 310.

A reflective layer 312 is then formed over the patterned bank layer 304 and within the openings spanning the sidewalls and bottom surface of each of the openings. The reflective layer may be electrically conducting. In an embodiment, the reflective layer 312 functions as the bottom electrode and a separate bottom electrode 310 is not required. The reflective layer 312 may be formed of a number of conductive and reflective materials, and may include more than one layer. In an embodiment, a reflective layer 312 comprises a metallic film such as aluminum, molybdenum, titanium, titanium-tungsten, silver, or gold, or alloys thereof. The reflective layer 312 may also include a conductive material which is not necessarily reflective, such as amorphous silicon, transparent conductive oxides (TCO) such as indium-tin-oxide (ITO) and indium-zinc-oxide (IZO), carbon nanotube film, or a transparent conducting polymer such as poly(3,4-ethylenedioxythiophene) (PEDOT), polyaniline, polyacetylene, polypyrrole, and polythiophene. In an embodiment, the reflective layer includes a stack of a conductive material and a reflective conductive material. In an embodiment, the reflective layer includes a 3-layer stack including top and bottom layers and a reflective middle layer wherein one or both of the top and bottom layers are transparent. In an embodiment, the reflective layer includes a conductive oxide-reflective metal-conductive oxide 3-layer stack. The conductive oxide layers may be transparent. For example, the reflective layer 312 may include an ITO-silver-ITO layer stack. In such a configuration, the top and bottom ITO layers may prevent diffusion and/or oxidation of the reflective metal (silver) layer. In an embodiment, the reflective layer includes a Ti—Al—Ti stack. In an embodiment, the reflective layer includes an ITO-Ti-ITO stack. In an embodiment, the reflective layer includes an ITO-Ti—Al—Ti-ITO stack. In an embodiment, the reflective layer is 1 µm or less in thickness. The reflective layer may be deposited using a suitable technique such as, but not limited to, PVD.

In the embodiment illustrated the sidewall passivation layer 316 spans sidewalls of the micro LED device 100 and covers the quantum well structure 108. In the embodiment illustrated the sidewall passivation layer 316 also covers the bottom surface of the reflective layer 312. The sidewall passivation layer 316 may also cover the reflective layer 312 on top of the patterned bank layer 304, however, this may also be aided by the formation of an intermediate insulating material 317. As shown, the sidewall passivation layer 316 may function in part to electrically insulate the top electrode layer 318 from the reflective layer 312.

Still referring to FIGS. 9A-9B, the light pipe 120 may be wider than the opening in the patterned bank layer 304 in which the micro LED device 100 is bonded. Likewise, the wavelength conversion layer 110 is wider than the opening in the patterned bank layer 304. Such a configuration may be used to ensure that light emitting above substrate 201 passes through the layers designed to tailor color emission (e.g. 110, 328).

Figure 9C:
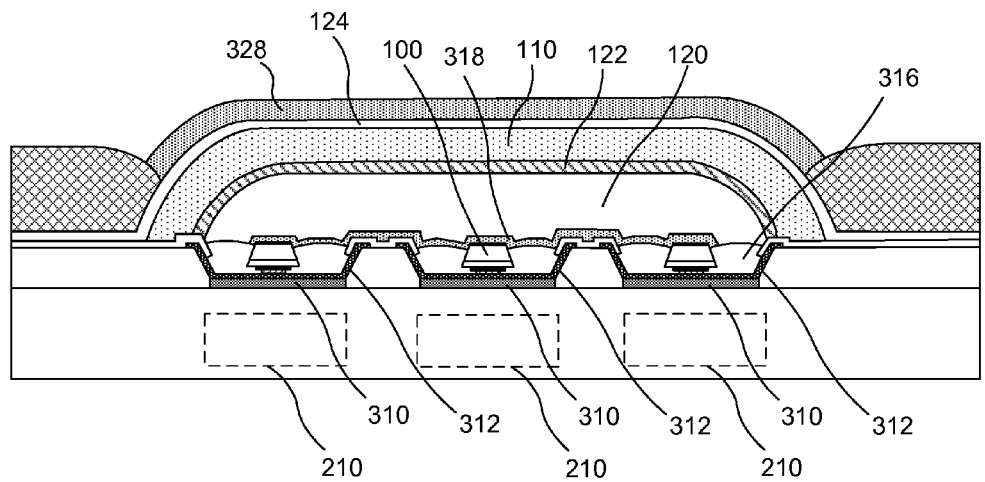
FIG. 9C is a cross-sectional side view illustration of a light pipe around a plurality of micro LED devices with top and bottom contacts within a plurality of reflective bank structures, and a wavelength conversion layer over the light pipe in accordance with an embodiment of the invention.

FIG. 9C is a cross-sectional side view illustrations of a light pipe around a plurality of micro LED devices with top and bottom contacts within a plurality of reflective bank structures, and a wavelength conversion layer over the light pipe in accordance with embodiments of the invention. The configuration illustrated in FIG. 9C is similar to that of FIG. 9B, with the difference being that the light pipe 120 is formed over multiple subpixels in a pixel, with each reflective layer 312 corresponding to a separate subpixel that is independently addressable by its own underlying circuitry 210. Similar to the configuration in FIGS. 9A-9B, the wavelength conversion layer 110 may be wider than the openings in the patterned bank layer 304 including the multiple reflective layers 312.

Figure 9D:
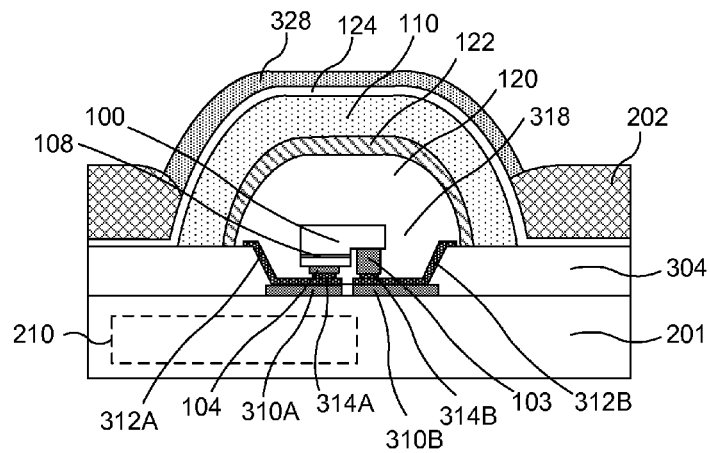
FIGS. 9D-9E are cross-sectional side view illustrations of a light pipe around a plurality of micro LED devices with bottom contacts within a reflective bank structure, and a wavelength conversion layer over the light pipe in accordance with embodiments of the invention.
Figure 9E:
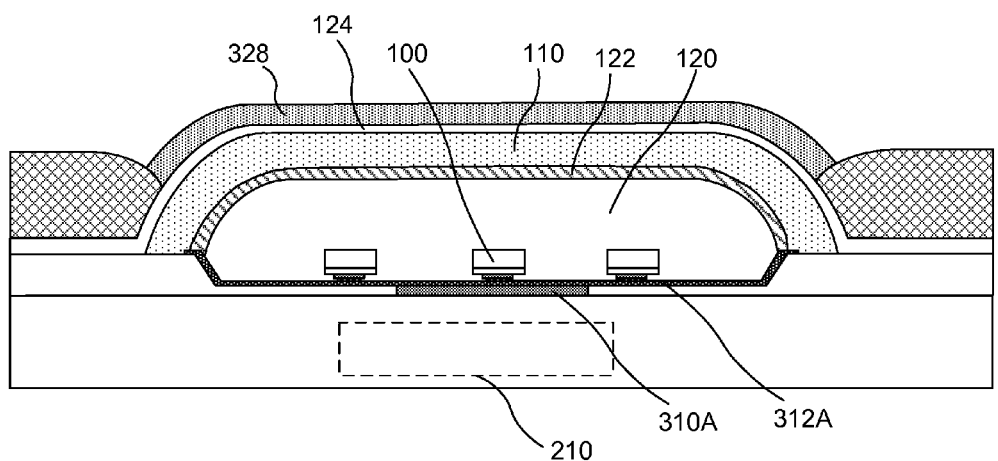
Figure 9F:
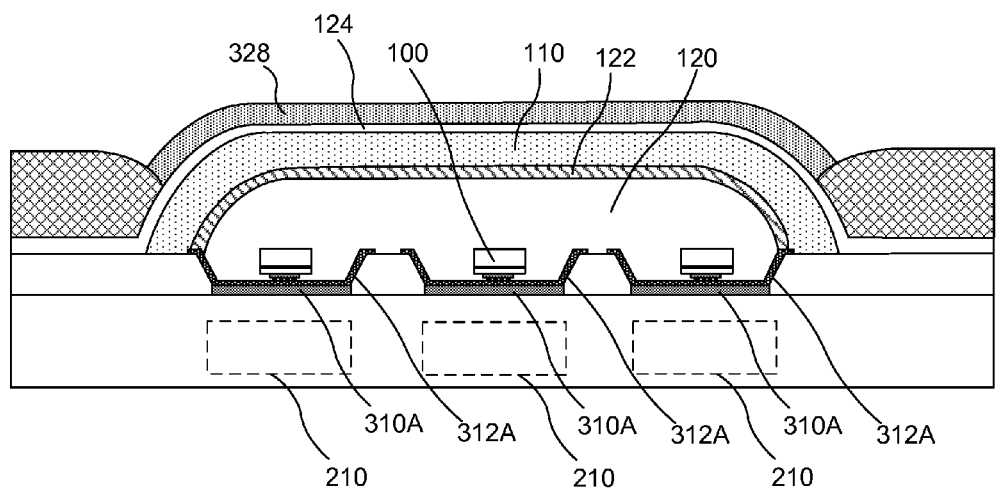
FIG. 9F is a cross-sectional side view illustration of a light pipe around a plurality of micro LED devices with bottom contacts within a plurality of reflective bank structures, and a wavelength conversion layer over the light pipe in accordance with an embodiment of the invention.

FIGS. 9D-9E are cross-sectional side view illustrations of a light pipe around a plurality of micro LED devices with bottom contacts within a reflective bank structure, and a wavelength conversion layer over the light pipe in accordance with embodiments of the invention. FIG. 9F is a cross-sectional side view illustrations of a light pipe around a plurality of micro LED devices with bottom contacts within a plurality of reflective bank structures, and a wavelength conversion layer over the light pipe in accordance with embodiments of the invention. FIGS. 9D-9F are similar to those of FIGS. 8D-8F with one difference being that the micro LED devices 100 include bottom contacts 104, 103 rather than both a bottom and top contact. As a result, it may not be required to form a top electrode layer to contact the ground line 330. Sidewall passivation layer 316 also may be omitted, and the light pipe 120 or other layers can electrically insulate the reflective layers 312A, 312B and quantum well structure 108. As illustrated, reflective layers 312A, 312B are electrically insulated from one another, and may resemble the configuration of the bottom reflective layers 309A, 309B in FIG. 1B.

Figure 10:
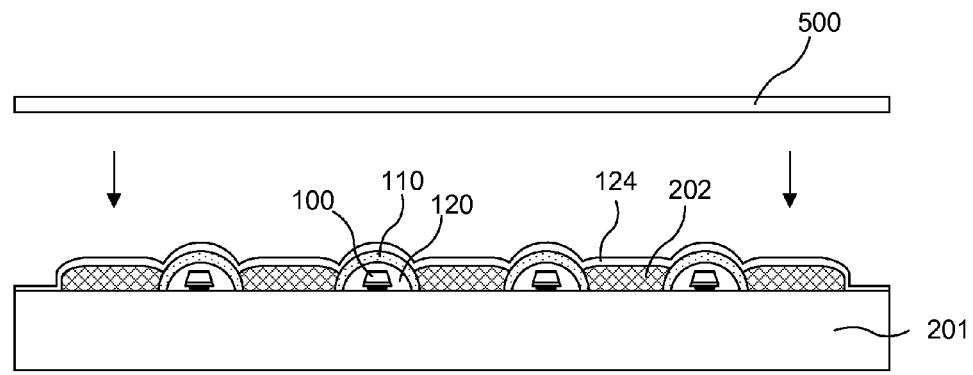
FIG. 10 is an illustration of a single side manner for applying wavelength conversion layers over light pipes, and a black matrix between micro LED devices in accordance with an embodiment of the invention.
Figure 11:
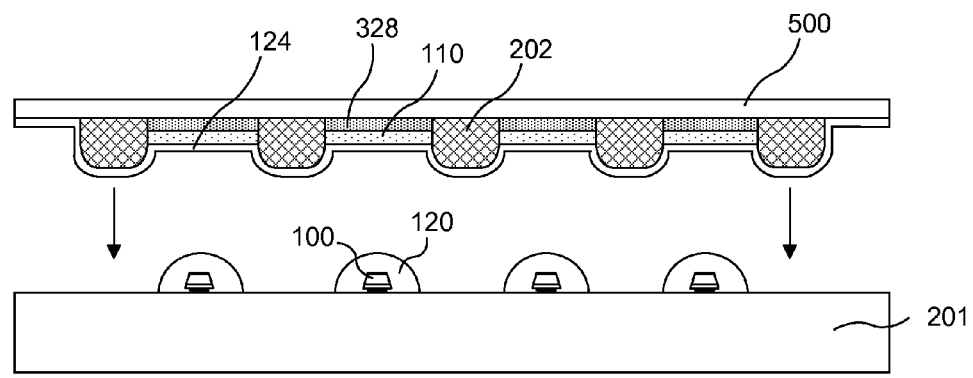
FIG. 11 is an illustration of a top press down manner for applying wavelength conversion layer over light pipes, and a black matrix between micro LED devices in accordance with an embodiment of the invention.

Referring now to FIGS. 10-11, alternative cover designs are described and illustrated for packaging the light emitting devices in accordance with embodiments. FIG. 10 is an illustration a single side fabrication manner for applying wavelength conversion layers and a black (or white) matrix between micro LED devices and light pipes in accordance with an embodiment. As illustrated, the wavelength conversion layers 110 and matrix 202 are formed on substrate 201 prior to applying a cover 500 over the light emitting devices and light pipes. Top cover 500 can be rigid or flexible, and can be applied in a variety of manners. In an embodiment, top cover 500 is a transparent plastic material and is laminated onto the light emitting device configuration. In an embodiment, top cover 500 is a rigid glass plate that is applied over the light emitting device configuration, and sealed around the peripheral edges of the substrate 201 with a sealant. A getter material may optionally be placed inside the sealed region containing the micro LED devices and the wavelength conversion layer 110 to absorb moisture, particularly if the wavelength conversion layer includes quantum dots.

FIG. 11 is an illustration of a top press down manner for applying wavelength conversion layers and a black (or white) matrix between micro LED devices and light pipes in accordance with an embodiment. In the embodiment illustrated in FIG. 11, the matrix 202, wavelength conversion layer 110, oxygen barrier film 324, and optional color filter layer 328 are formed on the top cover 500 and pressed down over the array of micro LED devices 100 and light pipes 120. In an embodiment, the top cover 500 of FIG. 11 is a rigid glass plate, and is sealed around the peripheral edges of the substrate 201 with a sealant. A getter material may optionally be placed inside the sealed region containing the micro LED devices and the wavelength conversion layer 110 to absorb moisture, particularly if the wavelength conversion layer includes quantum dots. Either of the top cover configurations of FIGS. 10-11 can be used when forming the lighting or display devices described and illustrated herein.

Figure 12:
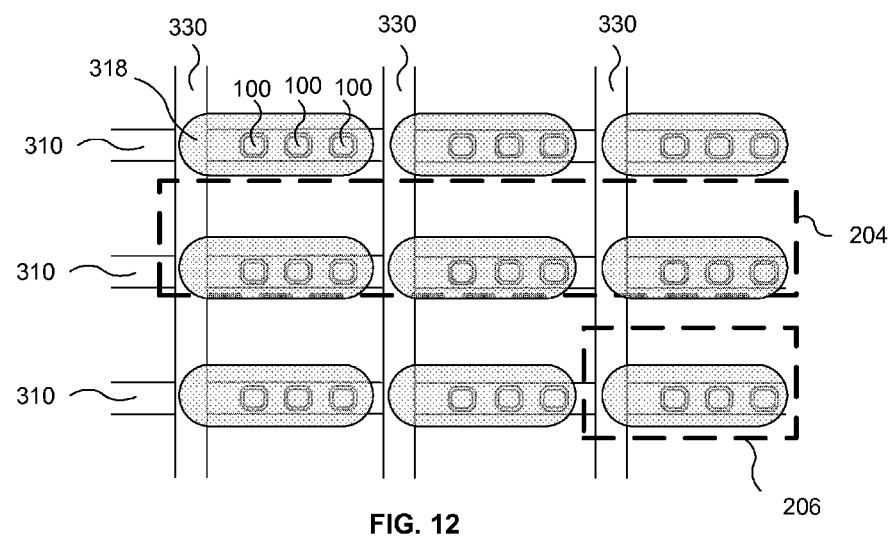
FIGS. 12-16 are top view schematic illustrations for various top and bottom electrode configurations for lighting or display applications in accordance with embodiments of the invention.

Referring now to FIGS. 12-16 top view schematic illustrations are provided for various top and bottom electrode configurations for lighting or display applications. It is to be appreciated, that the configurations are exemplary and that embodiments of the invention may be practiced using other configurations for incorporating micro LED devices and light pipes into light emitting devices. For example, each subpixel 206 is illustrated as including three micro LED devices 100, which may be within a light pipe. However, each subpixel may contain any number of micro LED devices within a light pipe. Alternatively, the micro LED devices 100 within a pixel 204 may be within a light pipe spanning multiple subpixels 206, or all subpixels within the pixel. A number of light pipe configurations are available. Referring now to FIG. 12, in an embodiment a plurality of micro LED devices 100 are bonded to bottom electrode lines 310. In the embodiment illustrated, ground lines 330 run perpendicular to the bottom electrode lines 310, separated by an insulating layer. Alternatively, the ground lines 330 and bottom electrode lines 310 are parallel to one another. In an embodiment, individual top electrode layers 318 can be formed over the micro LED devices 100 within a single light pipe connecting those micro LED devices 100 to ground lines 330. In other embodiments, a single top electrode layer 318 can connect a plurality of micro LED devices 100 from a plurality of light pipes to a single ground line 318. Depending upon the particular application, the lighting or display device may include an array of pixels 204. In the particular embodiment, illustrated each pixel 204 includes three subpixels 206, though such an arrangement is exemplary.

Figure 13:
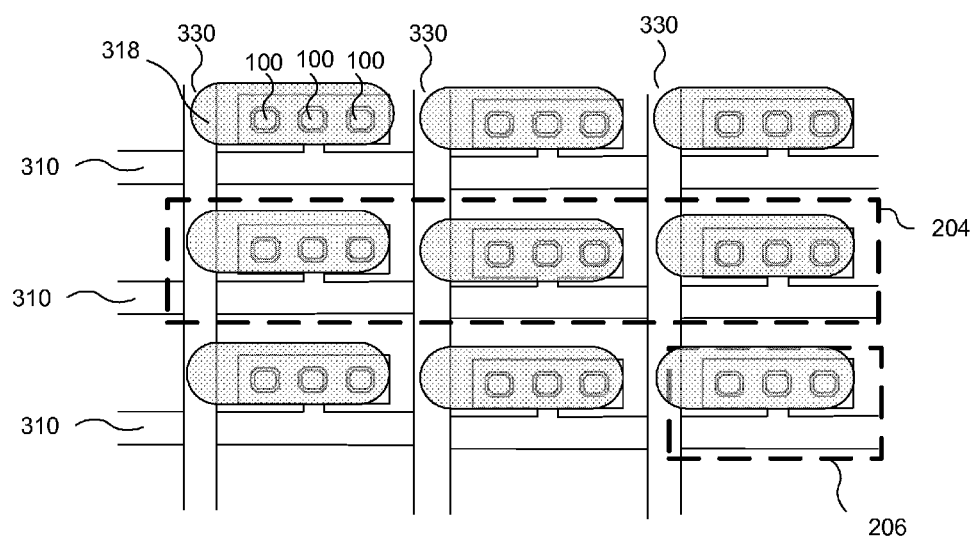

Referring to FIG. 13, in an embodiment, the micro LED devices 100 are bonded to electrode traces 311 connected with a bottom electrode line 310. Such a configuration may be suitable for reducing likelihood of shorting between the ground line 330 and bottom electrode line 310 with the top electrode layers 318. In an embodiment, individual top electrode layers 318 can be formed over the micro LED devices 100 in a single light pipe connecting those micro LED devices 100 to ground lines 330. In other embodiments, a single top electrode layer 318 can connect a plurality of micro LED devices 100 from a plurality of light pipes to a single ground line 318.

Figure 14:
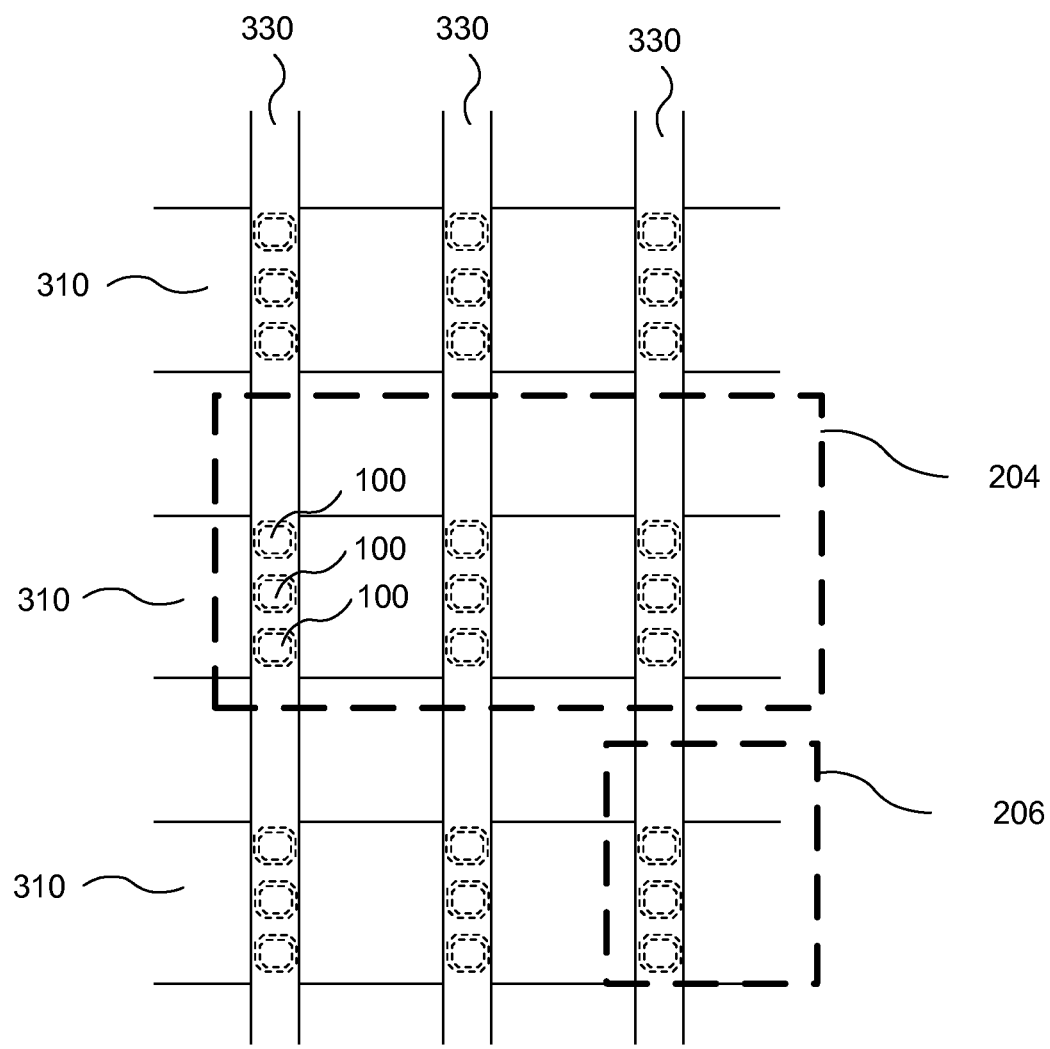

Referring to FIG. 14, in an embodiment, micro LED devices 100 are placed on the bottom electrode lines 310, and the ground lines 330 are formed over the micro LED devices 100, removing the requirement to form top electrode lines 310 to connect the micro LED devices to the ground lines 330. In this manner, the ground lines 330 are also the top electrode lines. In an embodiment, a plurality of ground lines 330 are formed over rows or columns of micro LED devices and light pipes. In other embodiments, a single ground plane 330 is formed over a plurality of rows/columns of micro LED devices and light pipes.

Figure 15:
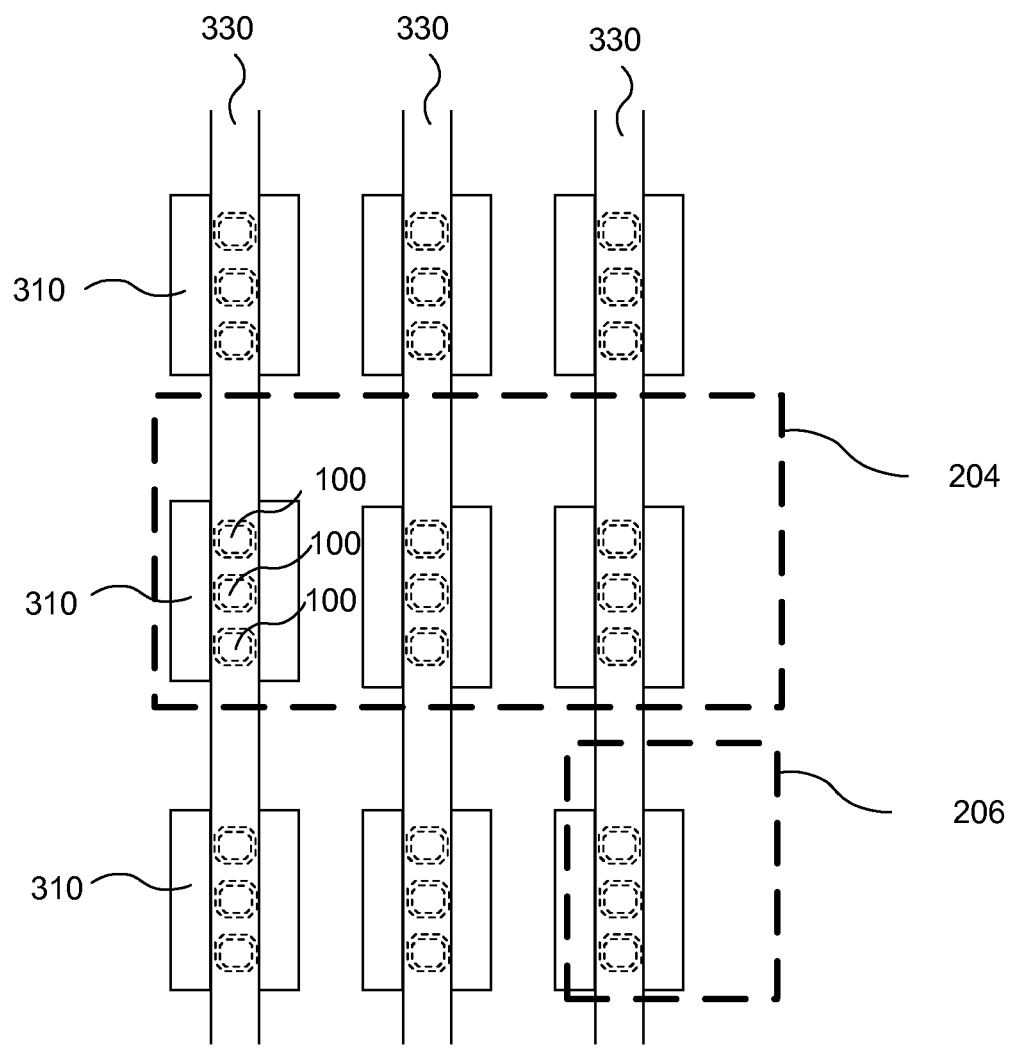
Figure 16:
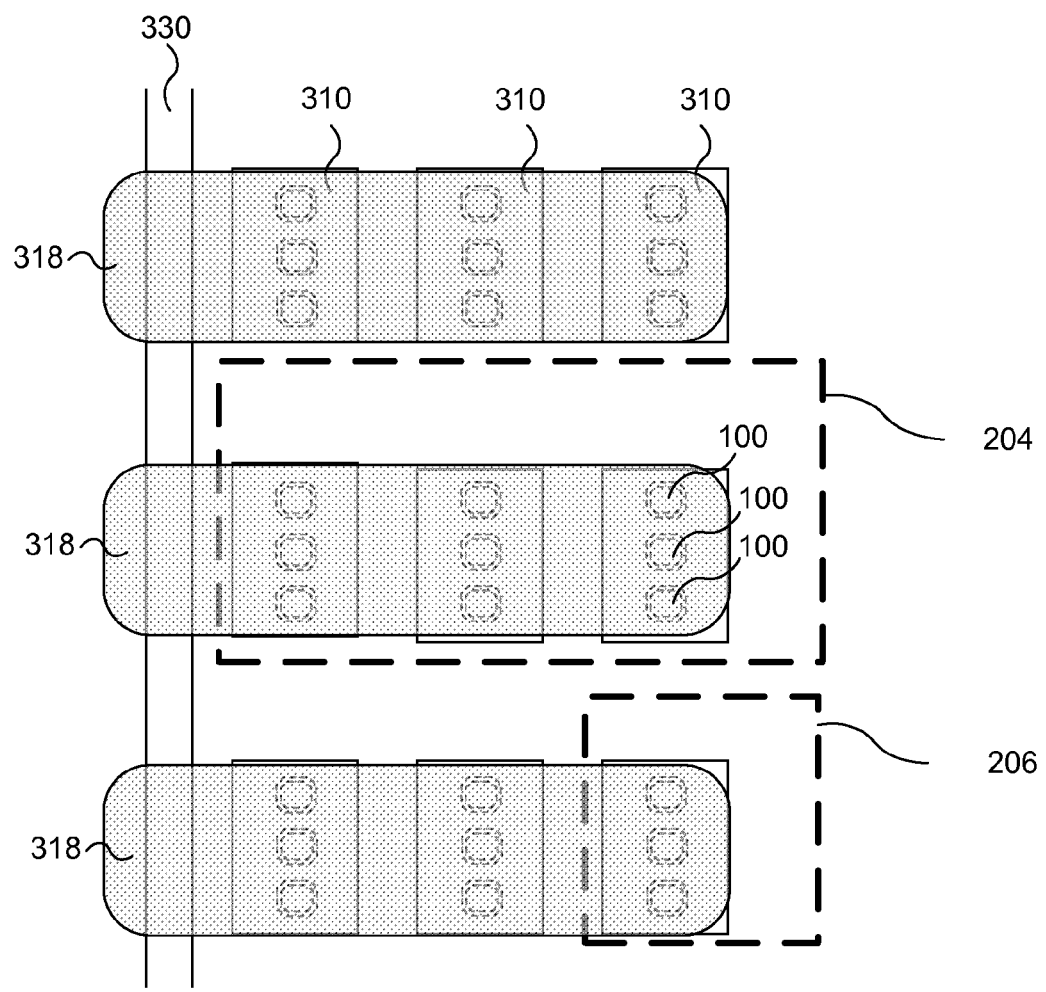

FIGS. 15-16 differ from the embodiments illustrated in FIGS. 12-14 in that the bottom electrodes 310 are in the form of separate pads. For example, rather than applying an operating current through an end of an electrode line, the operating current can be applied from below, which may be an electrode line or alternative working circuitry such as TFT circuitry. In this manner, it may be possible to address micro LED devices 100 within light pipes individually, or as a single group within a light pipe, rather in rows or columns. In the embodiment illustrated in FIG. 15 the micro LED devices are placed on the bottom electrodes 310, and the ground lines 330 are formed over the micro LED devices, removing the requirement to form top electrode lines 310 to connect the micro LED devices to the ground lines 330. In this manner, the ground lines 330 are also the top electrode lines. In an embodiment, a plurality of ground lines 330 are formed over rows or columns of micro LED devices. In other embodiments, a single ground plane 330 is formed over a plurality of rows/columns of micro LED devices. In the embodiment illustrated in FIG. 16 the micro LED devices are placed on the bottom electrodes 310, and the top electrode layer 318 connect the micro LED devices to one or more ground lines 330. In an embodiment, a single top electrode layer 318 connects a plurality of micro LED devices 100 in a single light pipe to a single ground line 330. In an embodiment, a single top electrode layer 318 connects a row or column of micro LED devices 100 to a ground line 330. In an embodiment, a top electrode layer 318 is formed over a plurality of rows/columns of micro LED devices to connect the plurality of micro LED devices and light pipes to a ground line 330.

Figure 17:
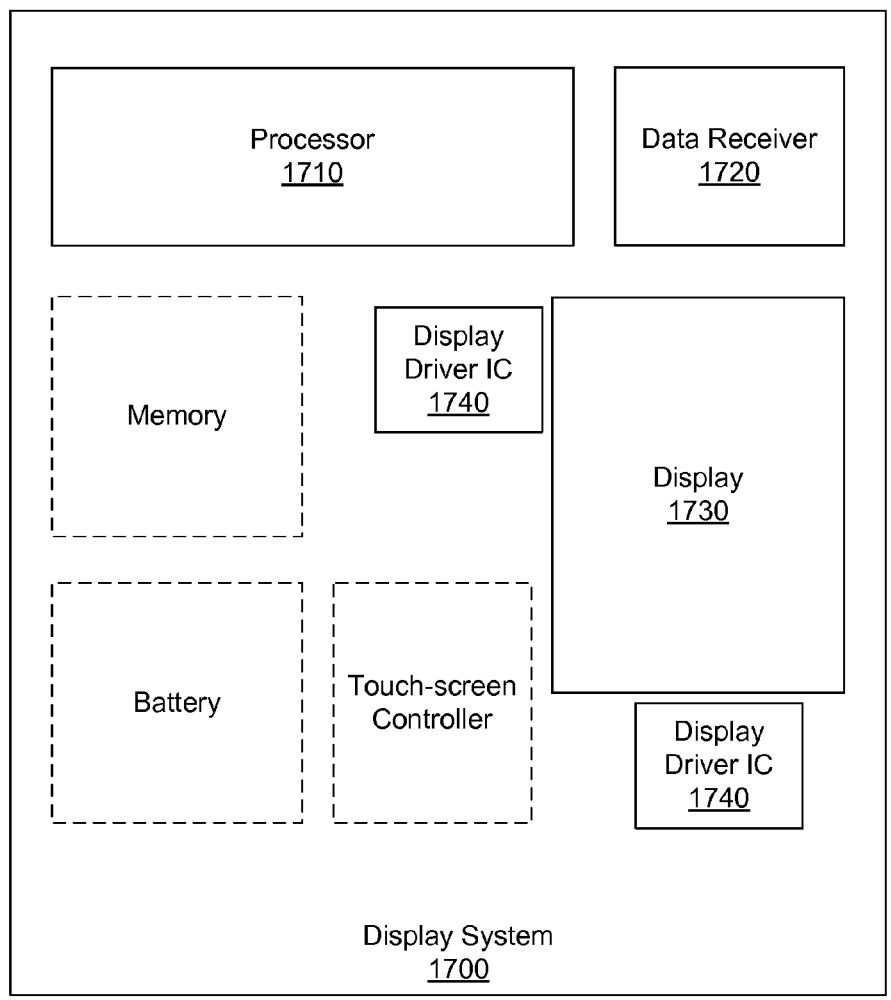
FIG. 17 is a schematic illustration of a display system in accordance with an embodiment of the invention.

FIG. 17 illustrates a display system 1700 in accordance with an embodiment. The display system houses a processor 1710, data receiver 1720, a display 1730, and one or more display driver ICs 1740, which may be scan driver ICs and data driver ICs. The data receiver 1720 may be configured to receive data wirelessly or wired. Wireless may be implemented in any of a number of wireless standards or protocols including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The one or more display driver ICs 1740 may be physically and electrically coupled to the display 1730.

In some embodiments, the display 1730 includes one or more micro LED devices 100 that are formed in accordance with embodiments of the invention described above. For example, the display 1730 may include a plurality of micro LED devices, a plurality of light pipes around the micro LED devices, and a plurality of wavelength conversion layers over the light pipes.

Depending on its applications, the display system 1700 may include other components. These other components include, but are not limited to, memory, a touch-screen controller, and a battery. In various implementations, the display system 1700 may be a television, tablet, phone, laptop, computer monitor, kiosk, digital camera, handheld game console, media display, ebook display, or large area signage display.

Figure 18:
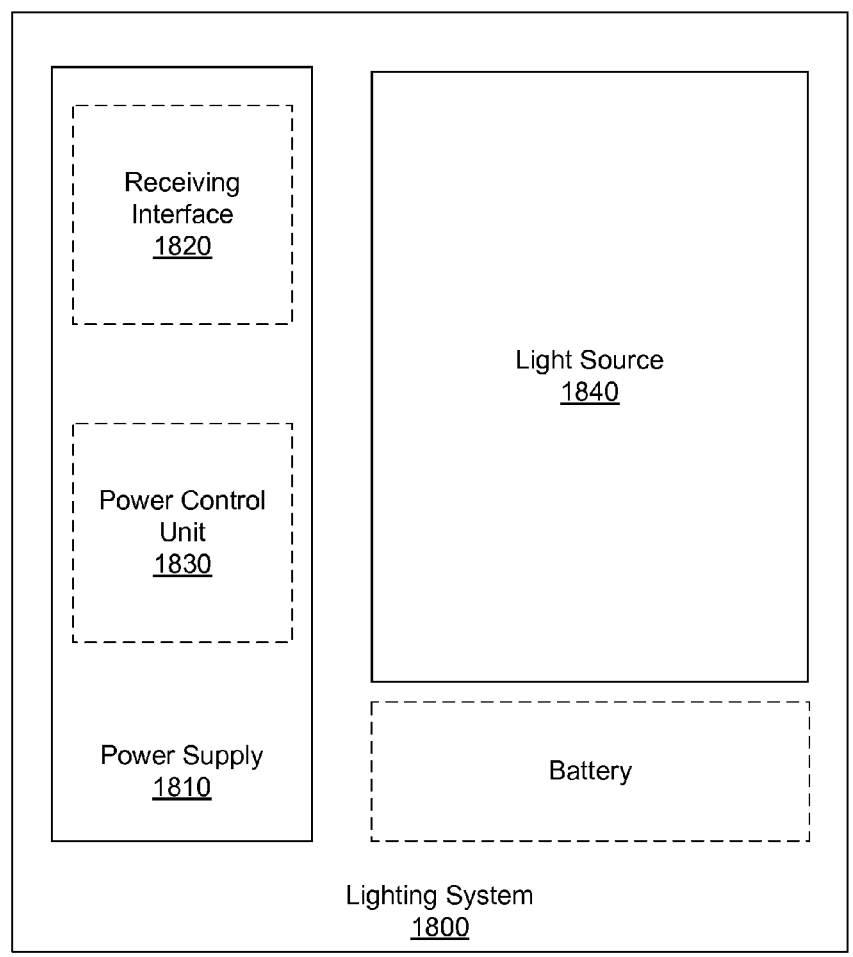
FIG. 18 is a schematic illustration of a lighting system in accordance with an embodiment of the invention.

FIG. 18 illustrates a lighting system 1800 in accordance with an embodiment. The lighting system houses a power supply 1810, which may include a receiving interface 1820 for receiving power, and a power control unit 1830 for controlling power to be supplied to the light source 1840. Power may be supplied from outside the lighting system 1800 or from a battery optionally included in the lighting system 1800. In some embodiments, the light source 1840 includes one or more micro LED devices 100 that are formed in accordance with embodiments of the invention described above. For example, the light source 1840 may include a plurality of micro LED devices, a plurality of light pipes around the micro LED devices, and a plurality of wavelength conversion layers over the light pipes. In various implementations, the lighting system 1800 may be interior or exterior lighting applications, such as billboard lighting, building lighting, street lighting, panel lighting, light bulbs, and lamps.

In utilizing the various aspects of this invention, it would become apparent to one skilled in the art that combinations or variations of the above embodiments are possible for integrating micro LED devices, light pipes, and wavelength conversion layers into lighting and display application. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A light emitting device comprising:
   a micro LED device mounted on a substrate;
   a light pipe around the micro LED device; and
   a wavelength conversion layer over the light pipe, the wavelength conversion layer comprising phosphor particles;
   wherein the light pipe is designed to allow refraction of incident light from the micro LED device out of the light pipe toward the wavelength conversion layer, and to cause internal reflection and lateral spreading of incident light from the micro LED device within the light pipe.

2. The light emitting device of claim 1, wherein the micro LED device has a maximum width of 1 μm-100 μm.

3. The light emitting device of claim 1, wherein the light pipe is elongated dome shaped.

4. The light emitting device of claim 1, wherein a lateral length of the light pipe is greater than a thickness of the light pipe.

5. The light emitting device of claim 1, wherein the phosphor particles are quantum dots.

6. The light emitting device of claim 1, wherein the phosphor particles exhibit luminescence due to their composition and do not qualify as quantum dots.

7. The light emitting device of claim 1, wherein the phosphor particles are dispersed in a polymer or glass matrix.

8. The light emitting device of claim 1, wherein a refractive index of the light pipe is within 0.1 of a refractive index of the wavelength conversion layer.

9. The light emitting device of claim 8, wherein the light pipe and the wavelength conversion layer comprise the same matrix material.

10. The light emitting device of claim 1, wherein the light pipe is around a plurality of micro LED devices to cause internal reflection of incident light from the plurality of micro LED devices within the light pipe.

11. The light emitting device of claim 1, further comprising a reflective layer directly over the micro LED device.

12. The light emitting device of claim 11, wherein the reflective layer is over the wavelength conversion layer.

13. The light emitting device of claim 11, wherein the reflective layer is between the light pipe and the wavelength conversion layer.

14. The light emitting device of claim 1, further comprising a reflective layer beneath the micro LED device and the light pipe.

15. The light emitting device of claim 14, wherein the micro LED device is within a reflective bank structure.

16. The light emitting device of claim 1, comprising an array of micro LED devices, a corresponding array of light pipes around the array of micro LED devices, and an array of wavelength conversion layers over the array of light pipes.

17. The light emitting device of claim 16 wherein the array of wavelength conversion layers comprises multiple groups of wavelength conversion layers, with each group designed to emit a different color emission spectrum.

18. The light emitting device of claim 17, further comprising a plurality of pixels, each pixel comprising at least one wavelength conversion layer from each of the multiple groups of wavelength conversion layers.

19. The light emitting device of claim 1, further comprising:
an array of pixels, each pixel comprising a plurality of subpixels designed for different color emission spectra, wherein the plurality of subpixels comprises:
a first subpixel including:
a first micro LED device;
a first light pipe around the first micro LED device;
a first wavelength conversion layer comprising first phosphor particles over the first light pipe; and
a second subpixel including:
a second micro LED device;
a second light pipe around the second micro LED device;
a second wavelength conversion layer comprising second phosphor particles over the second light pipe; and
wherein the first and second micro LED devices have the same composition for the same emission spectrum, and the first and second phosphor particles are designed for different color emission spectra.

20. The light emitting device of claim 1, further comprising:
an array of pixels, each pixel comprising a plurality of subpixels designed for different color emission spectra, wherein the plurality of subpixels comprises:
a first subpixel including:
a first micro LED device;
a first light pipe around the first micro LED device;
a first wavelength conversion layer comprising first phosphor particles over the first light pipe; and
a second subpixel including:
a second micro LED device;
a second light pipe around the second micro LED device;
wherein a wavelength conversions layer comprising phosphor particles is not formed over the second light pipe.

21. The light emitting device of claim 1, further comprising:
an array of pixels, each pixel comprising a plurality of subpixels designed for different color emission spectra;
an array of light pipes corresponding to the array of pixels, each light pipe spanning the plurality of subpixels of a corresponding pixel.

22. The light emitting device of claim 21, further comprising a micro LED device mounted within each subpixel in each pixel.

23. The light emitting device of claim 21, further comprising a micro LED device within each light pipe, wherein a micro LED device is not mounted within every subpixel corresponding to a light pipe.

24. The light emitting device of claim 21, further comprising a plurality of different wavelength conversion layers designed for different color emission spectra formed over each light pipe where it spans over the plurality of subpixels of a corresponding pixel.

* * * * *